(12) United States Patent
Kouwenhoven

(10) Patent No.: US 9,330,283 B2
(45) Date of Patent: May 3, 2016

(54) HIGH-FREQUENCY RMS-DC CONVERTER USING CHOPPER-STABILIZED SQUARE CELLS

(71) Applicant: Linear Technology Corporation, Milpitas, CA (US)

(72) Inventor: Michael Hendrikus Laurentius Kouwenhoven, Morgan Hill, CA (US)

(73) Assignee: Linear Technology Corporation, Milpitas, CA (US)

( * ) Notice: Subject to any disclaimer, the term of this patent is extended or adjusted under 35 U.S.C. 154(b) by 204 days.

(21) Appl. No.: 14/092,131

(22) Filed: Nov. 27, 2013

(65) Prior Publication Data

US 2014/0233288 A1    Aug. 21, 2014

Related U.S. Application Data

(60) Provisional application No. 61/767,628, filed on Feb. 21, 2013.

(51) Int. Cl.
| | |
|---|---|
| *G06G 7/20* | (2006.01) |
| *H02M 7/217* | (2006.01) |
| *G01R 19/02* | (2006.01) |
| *G01R 21/10* | (2006.01) |

(52) U.S. Cl.
CPC *G06G 7/20* (2013.01); *G01R 19/02* (2013.01); *G01R 21/10* (2013.01); *H02M 7/217* (2013.01)

(58) Field of Classification Search
CPC ....... H02M 7/217; G01R 19/02; G01R 21/10; G06G 7/20
See application file for complete search history.

(56) References Cited

U.S. PATENT DOCUMENTS

| | | |
|---|---|---|
| 5,489,868 A | 2/1996 | Gilbert |
| 5,581,211 A | 12/1996 | Kimura |
| 6,172,549 B1 | 1/2001 | Gilbert |
| 6,204,719 B1 | 3/2001 | Gilbert |
| 6,429,720 B1 | 8/2002 | Gilbert |
| 6,549,057 B1 | 4/2003 | Gilbert |
| 7,002,394 B1 | 2/2006 | Gilbert |

(Continued)

FOREIGN PATENT DOCUMENTS

| | | |
|---|---|---|
| EP | 1043593 A1 | 10/2000 |
| EP | 1475641 A2 | 11/2004 |

OTHER PUBLICATIONS

Godoy, Philip. Chopper Stabilization of Analog Multipliers, Variable Gain Amplifiers, and Mixers. IEEE Journal of Solid-State Circuits, vol. 43, No. 10, Oct. 2008, pp. 2311-2321.

(Continued)

*Primary Examiner* — Jung Kim
(74) *Attorney, Agent, or Firm* — Edward C. Kwok; Hogan Lovells US LLP

(57) ABSTRACT

An RMS-DC converter includes a chopper-stabilized square cell that eliminates offset, thus enabling high-bandwidth operation. The chopper-stabilized offset requires only a small portion of the circuitry (i.e., a single component square cell) which operates at high frequencies, and is amenable to using high-bandwidth component square cells. Using the chopping technique minimizes required device sizes without compromising an acceptable square cell dynamic range, thereby maximizing the square cell bandwidth. The RMS-DC converter consumes less power than conventional RMS-to-DC converters that requires a high-frequency variable gain amplifier.

15 Claims, 34 Drawing Sheets

(56) References Cited

U.S. PATENT DOCUMENTS

| | | | |
|---|---|---|---|
| 7,197,292 B1 | 3/2007 | Kouwenhoven et al. | |
| 7,224,216 B2 * | 5/2007 | Thompson | H03F 1/02 |
| | | | 327/124 |
| 7,250,747 B1 | 7/2007 | Ammar | |
| 7,342,431 B2 | 3/2008 | Zou | |
| 7,545,302 B1 * | 6/2009 | Silva | G06J 1/00 |
| | | | 341/143 |
| 7,622,981 B2 | 11/2009 | Zou | |
| 7,697,909 B2 | 4/2010 | Kouwenhoven | |
| 8,373,487 B1 | 2/2013 | Roger | |
| 8,422,970 B1 | 4/2013 | van Staveren et al. | |
| 2008/0084199 A1 | 4/2008 | Hawkins et al. | |
| 2008/0297256 A1 | 12/2008 | Eken et al. | |
| 2009/0243592 A1 | 10/2009 | Reichel et al. | |
| 2012/0146819 A1 * | 6/2012 | Silva | G01R 19/02 |
| | | | 341/110 |

OTHER PUBLICATIONS

M. Kouwenhoven, A. Van Staveren. A 2GHz Mean-Square Power Detector with Integrated Offset Chopper. Digest of Technical Papers, ISSCC 2005, pp. 124-125 and 588.

European Search Report for Application No. 13198155.7-1504/2770334, dated Oct. 8, 2014, 16 pages.

Zhang et al., A Low-Power Multi-band ECoG/EEG Interface IC, IEEE, 2010, 4 pages.

* cited by examiner

RF input signal

Chopper clock signal

Input signal to SQ1

Input signal to SQ2

Output signal SQ1, including offset

SQ1 offset

Output signal SQ2, including offset

SQ2 offset

Difference between square cell outputs, prior to second chopper

Offset difference output signal second chopper

Up-converted offset

HIGH-FREQUENCY RMS-DC CONVERTER USING CHOPPER-STABILIZED SQUARE CELLS

CROSS REFERENCE TO RELATED APPLICATIONS

The present application relates to and claims priority of U.S. provisional patent application ("Provisional Patent Application"), Ser. No. 61/767,628, entitled "High-Frequency RMS-DC Converter Using Chopper-Stabilized Square Cells," filed on Feb. 21, 2013. The disclosure of the Provisional Patent Application is hereby incorporated by reference in its entirety.

BACKGROUND OF THE INVENTION

1. Field of the Invention

The present invention relates to radio transmitter systems. More particularly, the present invention relates to Root-Mean-Square (RMS) to DC converters, also called "RMS power detectors."

2. Discussion of the Related Art

RMS power detectors typically operate within a dynamic range at a wide range of radio frequencies, thus RMS power detectors are found in numerous kinds of communication and instrumentation equipment, with special application in accurate measurements of average power levels of signals over time, independently of signal composition or "wave shape".

One design challenge for RMS power detectors is to provide a sufficient dynamic range at high input frequencies, as measured by, for example, a ratio of the largest input power level to the smallest input power level that can be accurately detected. Typically, the useable dynamic range of an RMS-DC converter decreases as the input frequency increases. This tradeoff is generally determined by the "square cell", which is a circuit block that calculates the square of its input signal (i.e. the product of the input signal with itself). Many different square cell structures are known in the literature (see, e.g., U.S. Pat. Nos. 7,622,981, 5,489,868, 5,581,211, 6,549,057 and 7,342,431; see, also, the article "A 2 GHz mean-square power detector with integrated offset chopper" ("Kouwenhoven") by M. Kouwenhoven et al., published in Digest of Technical Papers, ISSCC 2005, pp. 124-125, February 2005). Although most square cells have a high bandwidth, most have a poor dynamic range because of DC offsets resulting from device mismatches. To achieve a useful dynamic range, many RMS-DC converters are enhanced by dynamic range enhancement techniques. However, such dynamic range enhancement techniques often significantly reduce the maximum operating frequency of the RMS power detector. The highest frequency achieved by RMS power detectors currently available on the market is typically not greater than 10 GHz, with a useable dynamic range of about 30 dB at that frequency. The maximum operating frequency does not scale well with the transition or cut-off frequency ($f_T$) of a bipolar device, which is used in practically all RF RMS power detectors. The transit time of minority carriers through the base does not determine the bandwidth of the square cell. Specifically, the square cell bandwidth is determined by the base resistance and base-emitter junction capacitance.

Most square cell operations are based on the exponential relation in a bipolar transistor between the collector current and the base-emitter voltage. Alternatively, in the few MOS[1]-based examples, square cell operations may be based on the quadratic relation between the drain current and the gate-source voltage in an MOS device.

[1] Metal-Oxide-Semiconductor

The dynamic range of an RMS power detector is primarily limited by the DC offset resulting from mismatches between the bipolar or MOS devices used in the RMS power detector. The bandwidth of an RMS power detector is generally large, limited by junction capacitances, together with the impedance of the voltage source driving the cell. Other methods for realizing a squaring or root-mean-square function include using an analog multiplier as the square cell (see, e.g., Kouwenhoven) or using trans-linear circuit techniques, such as those disclosed in U.S. Pat. No. 7,002,394. The bandwidth of a circuit using any of these techniques is generally lesser than those of other types of square cells, while its dynamic range is similar. Enlarging the devices, though a proven technique to reduce the effects of device offsets, is not effective in enhancing the dynamic range of a square cell. For example, even doubling the device sizes, the resulting offset may be reduced by merely a factor of $\sqrt{2}$, and thereby improves the output dynamic range by only 3 dB, while the bandwidth is reduced by a factor 2. As a result, due to the quadratic nature of the square cell, the input dynamic range is improved only by 1.5 dB. A dynamic range extension by 9 dB would require the devices to be scaled up by a factor of 64, thereby reducing the bandwidth significantly.

Trimming is another alternative approach to reduce offsets without increasing device sizes. In a square cell, trimming allows a higher bandwidth for a given dynamic range. Trimming, however, cannot remove all offset components from the square cell output signal (see, e.g., Kouwenhoven). Especially over the full operating temperature range the effectiveness of trimming is limited. Large device sizes are required to suppress the remaining offset components.

The prior art relies significantly on increasing device sizes to improve the square-cell dynamic range, at the expense of a reduced bandwidth of the square cell. However, device scaling cannot achieve both high bandwidth and a sufficiently wide dynamic range. Numerous circuit techniques may be used to increase the dynamic range of a square cell that is suitable for use in a high dynamic range RMS-DC converter, although most of these techniques limit the attainable RMS detector bandwidth.

As the dynamic range of an output signal of a square cell is much greater than the dynamic range of its input signal (typically at least two times in dB), both small offsets and noise components in the output signal path can significantly reduce the overall dynamic range of an RMS power detector. One method to increase the dynamic range of an RMS power detector is to compress the dynamic range of the square cell output signal, using a circuit with a non-linear transfer function. For example, U.S. Pat. No. 7,342,431 discloses a square cell followed by a DC LOG-amp. Such an approach has the advantage that only the square cell operates at high frequencies, while the rest of the circuitry is DC, thus enabling high-frequency operation, in principle. The disadvantages of such an approach includes (a) the effect of an offset generated inside the square cell on the dynamic range of the RMS power detector is not mitigated (i.e., to achieve a reasonable dynamic range, large devices and offset trimming are still required); (b) the attainable bandwidth is still significantly limited by the required large device sizes; and (c) temperature drift and frequency dependence of the square cell transfer function are directly observable in the overall detector transfer function.

Other RMS-DC converters extend the dynamic range of an RMS power detector by placing a variable gain amplifier (VGA) at the input terminal of a square cell, as depicted in FIG. 1. As shown in FIG. 1, input signal 101 is provided to VGA 102, which gain is controlled by VGA gain control circuit 105 based on output signal 104, in such a way that the magnitude of input signal 108 of square cell 107 is kept substantially constant over the full input power dynamic range of RMS power detector 100. Low pass filter 106 removes the unwanted high frequency components from the output signal of the square cell and RMS power detector 100. The impact of any offset voltage in square cell 107 is significantly reduced, since output signal 104 is much larger than the offset over the full detector dynamic range.

RMS power detector 100 has the advantage that it allows realization of a wide dynamic range RMS-DC converter with high accuracy and temperature stability. RMS power detector also has an disadvantage that, as VGA 102 processes RF input signal 101, VGA 102 requires a large bandwidth over the full VGA gain range (e.g., at least equal to the required detector dynamic range in dB). Another disadvantage of RMS power detector 100 is that its attainable bandwidth is primarily limited by the bandwidth of the VGA. The maximum operating frequency of RMS power detector 100 is thus associated with the bandwidth of the VGA, which in turn increases with the bipolar transition frequency $f_T$.

Another approach to extend dynamic range uses low-frequency feedback in combination with two square cells, as depicted in FIG. 2. As shown in FIG. 2, first square cell 207a is driven by high-frequency input signal 201, while second square cell 207b is driven by a DC signal, which is derived by feedback control circuit 209 from detector output signal 204. Feedback control circuit 209 has a (non-linear) transfer function that determines the overall transfer of the power detector. At sufficiently high loop gain, the feedback loop equalizes the output signals 205a and 205b of square cells 207a and 207b, respectively. The difference 206 of output signals 205a and 205b is integrated by integrator 208 to provide output signal 204 of RMS power detector 200. For a high loop gain, the overall transfer of the detector—from RF input power to DC output voltage—becomes equal to the inverse of feedback transfer 209.

RMS power detector 200 has similar characteristics to the RMS power detector described above that compresses the dynamic range of the square cell output signal using a circuit with a non-linear transfer function. Again, only a single square cell need to operate at high frequencies, thus enabling a high RMS power detector bandwidth to be achieved. Another advantage is the matching of temperature drift and device offsets, so as to improve the accuracy and dynamic range. These advantages are compared to those achieved for the RMS power detector that compresses the dynamic range. The disadvantages of RMS power detector 200 includes (a) requiring both large device sizes and trimming of the square cells to achieve a reasonable dynamic range, thereby undesirably reducing the attainable bandwidth; (b) the feedback loop typically results in a slow detector response (i.e., a lengthy response time), and (c) potential instability since the loop gain varies significantly as a function of the input power level applied to the detector.

Yet another bandwidth extension technique uses linear analog multipliers to carry out the squaring operations, and applies chopping to eliminate device offsets generated inside the multipliers. This technique is discussed in Kouwenhoven and U.S. Pat. No. 7,197,292. The analog multipliers can implement chopping, which is a much more effective way for reducing offsets in a square cell than both device scaling and trimming, and potentially allows higher detector operating frequencies. A multiplier-based square cell, however, has a considerably lower bandwidth than other square cells and is therefore less suited to realize an RMS-DC converter at very high frequencies. Also, a multiplier-based square cell operates at much higher current densities and results in higher overall power consumption.

SUMMARY

The present invention provides an RMS-DC converter architecture that uses chopping around—intrinsically high-bandwidth—square cells to eliminate offset, thus enabling high-bandwidth operation because (a) only a small portion of the circuitry (i.e., a single square cell) operates at high frequencies; (b) high-bandwidth square cells may be used; and (c) chopping minimizes the required device size to achieve an acceptable square cell dynamic range, thereby maximizing the square cell bandwidth. In addition, an RMS-DC converter according to the present invention consumes less power than conventional RMS converter of the prior art that requires a high-frequency variable gain amplifier.

In accordance with one embodiment of the present invention, an RMS to DC converter applies chopping to a combination of two square cells so as to eliminate DC offset from the square cells' output signals. The RMS to DC converter of the present invention may include a first input switch for receiving an input signal supplied to the RMS to DC converter, and transferring the input signal alternatively to a first square cell or to a second square cell, but not to both simultaneously. A second input switch may receive a reference signal and transfer it alternately to the second square cell or to the first square cell, but not to both simultaneously. The first and second input switches are controlled so as to provide the first square cell with the input signal, when the second square cell is supplied with the reference signal, and to supply the first square cell with the reference signal, when the second square cell is provided with the input signal. A subtraction operation may be performed to provide a difference signal representing a difference between the output signals of the first and second square cells. The output signals may be filtered either before or after the subtraction operation, or both, to eliminate high-frequency components.

In one embodiment of the present invention, an output switch may be provided to change the polarity of the difference signal. A clock signal may control the states of the input switches and the output switch. The switches may be controlled at the same frequency, but a phase difference may exist between the control signals applied to the input switches and the control signal applied to the output switch—different combinations of clock signals can be applied to both switches.

In accordance with another embodiment of the present invention, the reference signal may be a DC signal, e.g. zero. The reference signal may also be a wave-shaped signal, and the chopped square cell determines the difference between the average power levels of the input signal and the reference signal.

In accordance with another embodiment of the present invention an RMS to DC converter may comprise a chopped square cell configuration, in which the first square cell receives an input signal supplied to the RMS to DC converter, and the second square cell receives a reference signal produced by a feedback circuit coupled to the output terminal of the RMS to DC converter. An output amplifier may provide an output signal responsive to the averaged difference between output signals of the square cells. The output amplifier may provide the output signal of the RMS to DC converter. The output amplifier may include a number of gain amplifier stages, one or more of which may have a variable gain adjustable in accordance with an adjustment signal. The feedback circuit may produce a DC or AC feedback signal derived from the output signal of the RMS to DC converter. The feedback signal may be supplied to the input of the second square cell. Also, the feedback circuit may produce an additional signal applied to control the gain of one or more gain amplifiers in the output amplifier.

In accordance with one embodiment of the present invention, the switch control signal (i.e. the chopper signal) may have a frequency that is less than the lowest frequency of the input signal. The frequency of the switch control signal may also be lower than the bandwidth of the input signal, (i.e. lower than the difference between the highest and the lowest frequencies of the input signal). The conversion technique of the present invention may improve performance of an RMS to DC converter by extending the dynamic range of the RMS to DC converter at a given operating frequency. Alternatively, the conversion technique of the present invention may extend useable operating frequency range of an RMS to DC converter while maintaining an acceptable dynamic range.

Offset chopping may be applied to a square cell, thereby enhancing the useful dynamic range for a given transistor size.

The present invention is better understood upon consideration of the detailed description below in conjunction with the accompanying drawings.

DETAILED DESCRIPTION OF THE PREFERRED EMBODIMENTS

Figure 1:
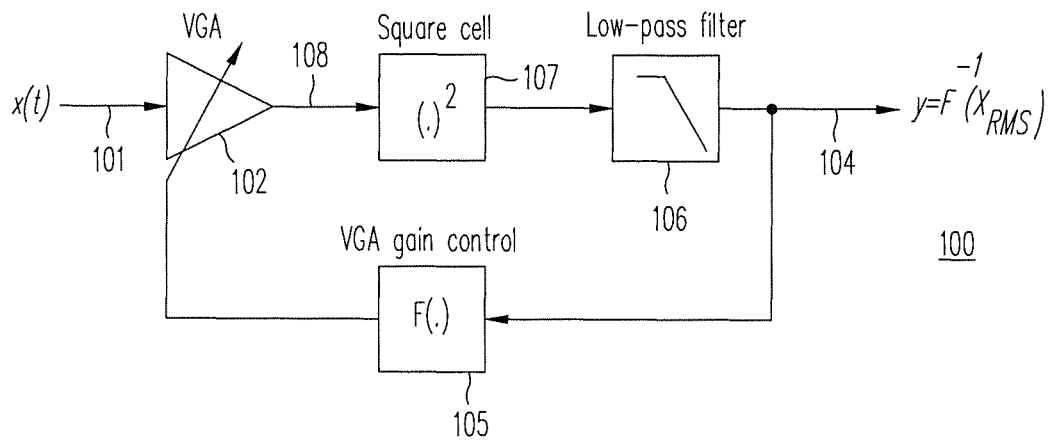
FIG. 1 shows an RMS-DC converter 100 which extends its dynamic range by placing variable gain amplifier (VGA) 102 at the input terminal of square cell 107.
Figure 2:
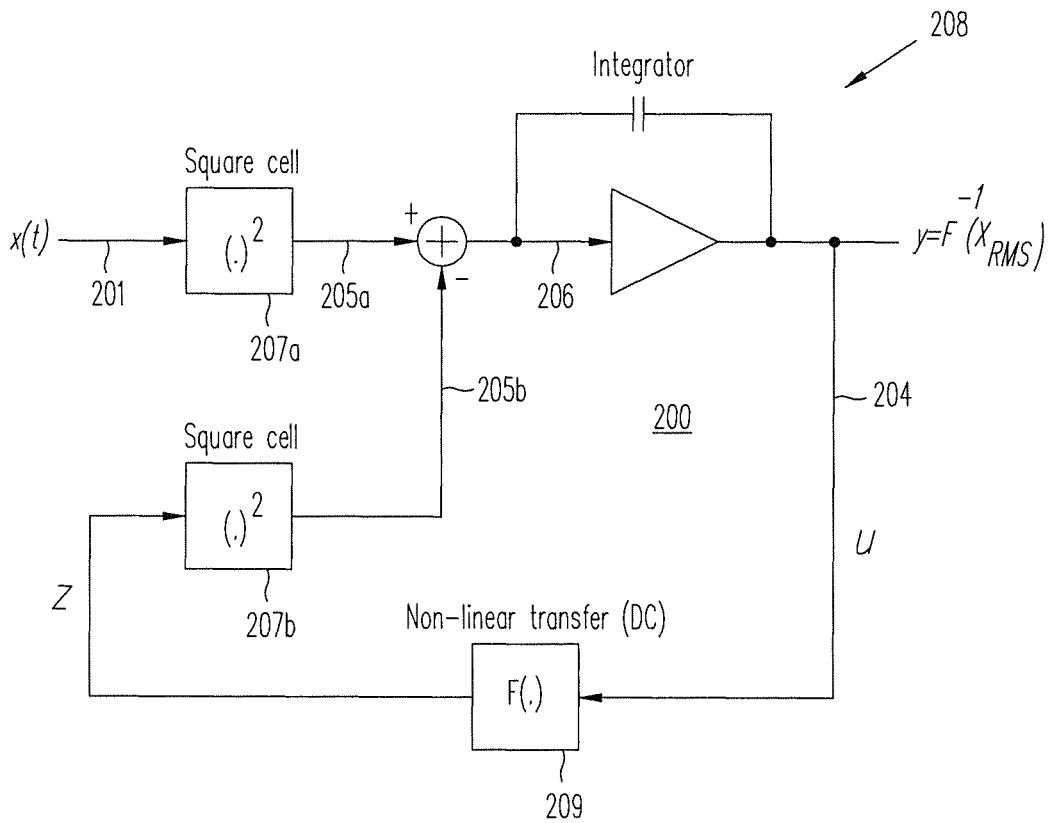
FIG. 2 shows RMS power detector 200, in which low frequency feedback is used in conjunction with square cells 207a and 207b.
Figure 3:
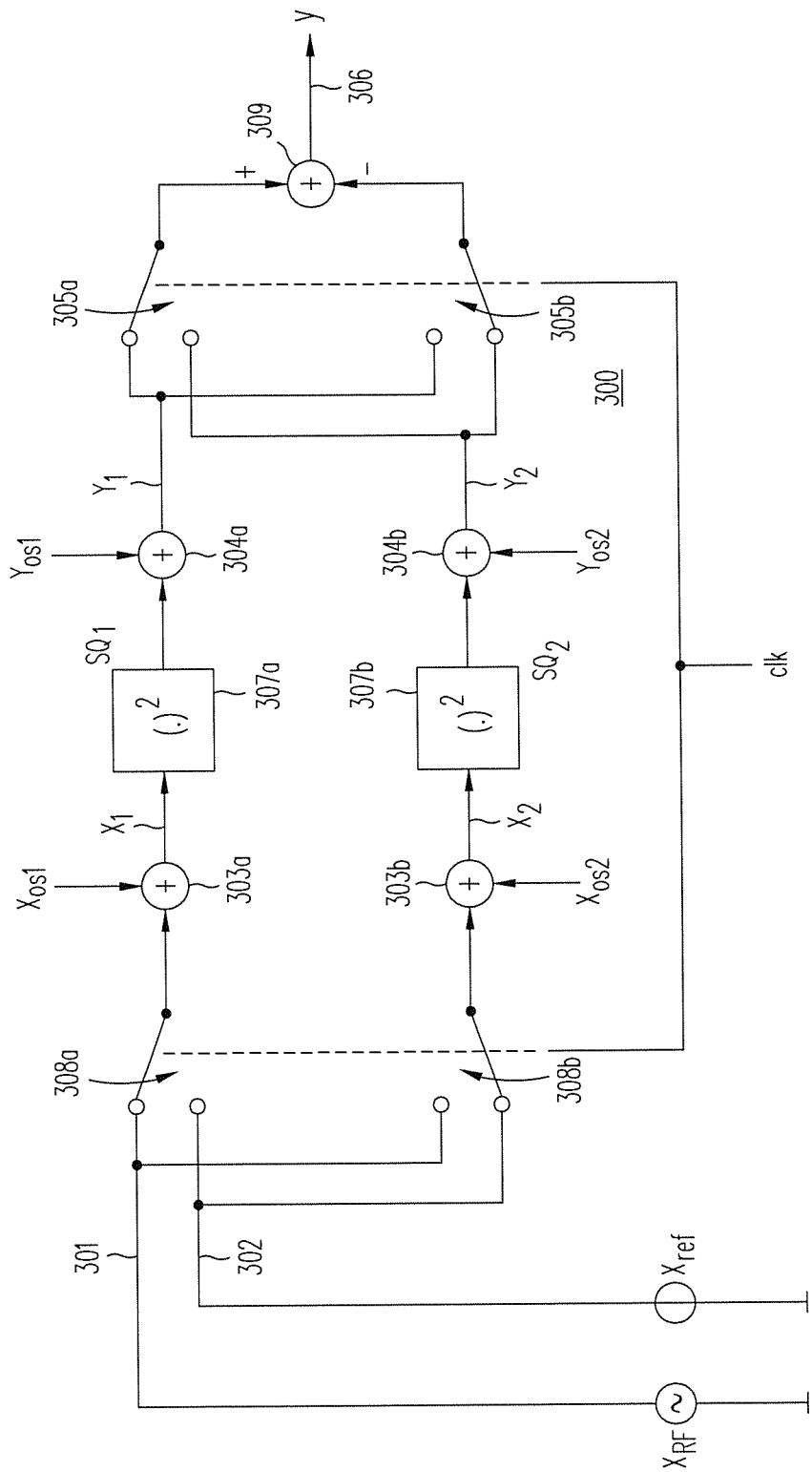
FIG. 3 illustrates chopper-stabilized square cell 300, in accordance with one embodiment of the present invention.

FIG. 3 illustrates chopper-stabilized square cell 300, in accordance with one embodiment of the present invention. As shown in FIG. 3, chopper-stabilized square cell 300 includes input signal 301 and reference signal 302, which are each selectively provided by either switches 308a or 308b to square cell 307a or square cell 307b, depending on the state of switches 308a and 308b. At any given time, if switch 308a is set to receive input signal 301, switch 308b is set to receive reference signal 302. Alternatively, if switch 308a is set to receive reference signal 302, switch 308b is set to receive input signal 301. As each square cell has internal offsets that add to either the input signal or the output signal, these offsets are represented by adders 303a and 303b that add offsets $X_{OS1}$ and $X_{OS2}$ to the signals provided to square cells 307a and 307b, respectively, and adders 304a and 304b that add offsets $Y_{OS1}$ and $Y_{OS2}$ to the output signals of square cells 307a and 307b, respectively. The output offset-adjusted output signals of square cells 307a and 307b are provided by switches 305a and 305b to difference circuit 309, which provides their difference as output signal 306 for chopper-stabilized square cell 300. The offset components $X_{OS1}$, $X_{OS2}$ and $Y_{OS1}$, $Y_{OS2}$ are uncorrelated and are each often large relative to output signal 306. Chopper-stabilized square cell 300 represents a balanced square cell that has an RF input and a reference input and which achieves a zero output signal for a zero input signal. Square cells that do not apply chopping according to the present invention have a limited dynamic range that is typically 20-30 dB.

Figure 13A:
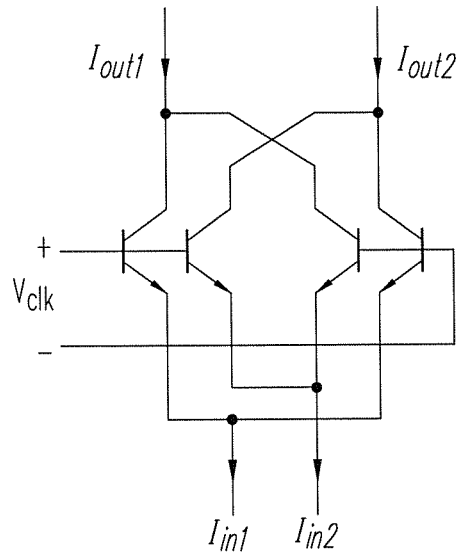
FIGS. 13(a) and 13(b) show current and voltage switches, respectively, that are suitable for implementing any of switches 308a, 308b, 305a and 305b.
Figure 13B:
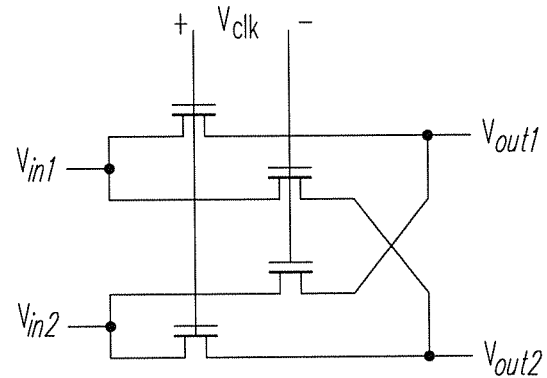
Figure 14A:
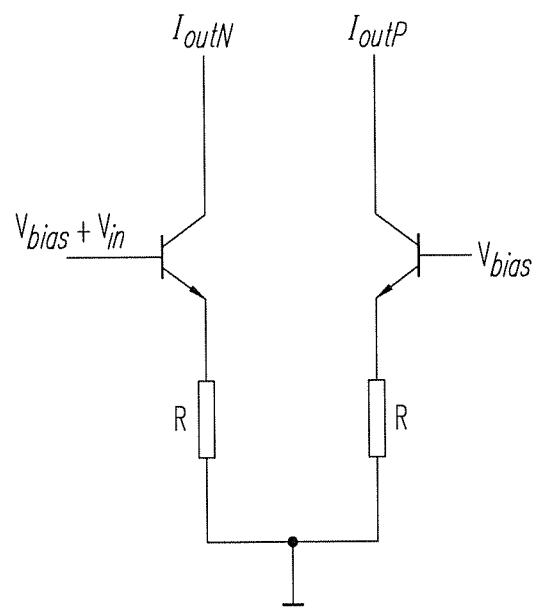
FIGS. 14(a) and 14(b) show square cell topologies that are suitable for use in the chopped square cell driven single-ended and differentially, respectively.
Figure 14B:
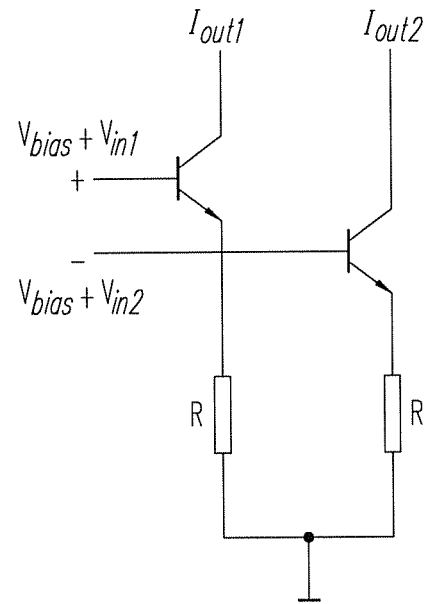

Each of switches 305a, 305b, 308a and 308b may be implemented as voltage switches (e.g. using MOS-transistors in triode), or as current switches (e.g., using bipolar or MOS differential pairs). Current switches may provide a higher bandwidth, but typically require an input amplifier to convert a high-frequency input voltage into an input current. FIGS. 13(a) and 13(b) show current and voltage switches, respectively, that are suitable for implementing any of switches 308a, 308b, 305a and 305b. FIGS. 14(a) and 14(b) illustrate, respectively, single-ended and differential square cells suitable for implementing square cells 307a and 307b. The chopper operation allows a simplification of the square cell topology (i.e., the DC reference current needed to achieve zero output current at zero input voltage is not required).

Chopping is a technique that reduces offset in amplifiers, for example. In chopping, the input signal is typically up-converted before amplification to an intermediate frequency (IF) that is higher than the highest frequency in the input signal, and then down-converted back to the original frequency. Any DC offset introduced in the amplifier is up-converted by the same operation that realizes the down-conversion of the amplified input signal. High-frequency ripple caused by the up-converted offset are eliminated by low-pass filtering. Up-conversion and down-conversion can be achieved simply changing the polarity of the input signal in accordance with the chopper frequency. In a square cell, this approach does not work, as the squaring operation rectifies the input signal—eliminating the polarity inversions—and thus produces an output signal component at DC, where the offset to be eliminated also resides. In order to achieve an output signal component at IF, rather than at DC, the square cell input signal is switched on and off at the chopper frequency.

Figure 4A:
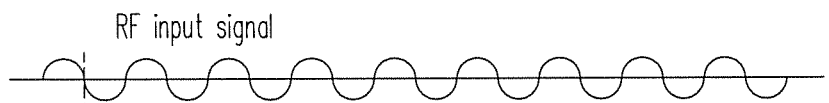
FIGS. 4(a) to 4(h) show the waveforms of various signals in chopper-stabilized square cell 300 of FIG. 3, when reference signal 302 is the ground reference (i.e., zero volts).
Figure 4B:
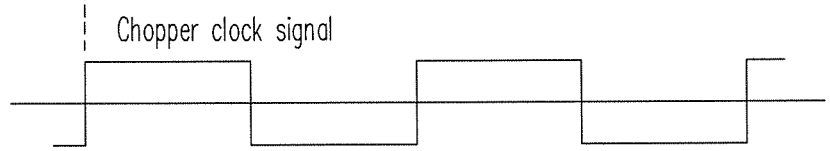
Figure 4C:
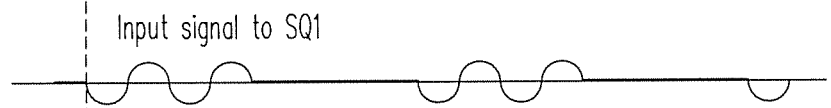
Figure 4D:
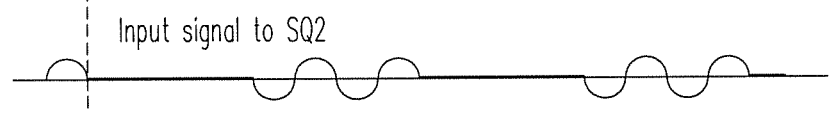
Figure 4E:
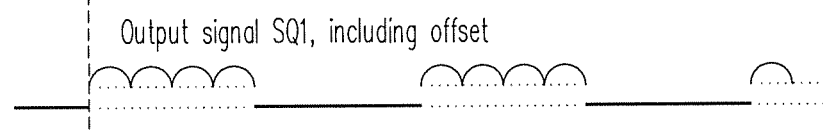
Figure 4F:
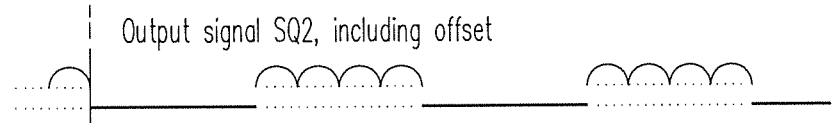
Figure 4G:
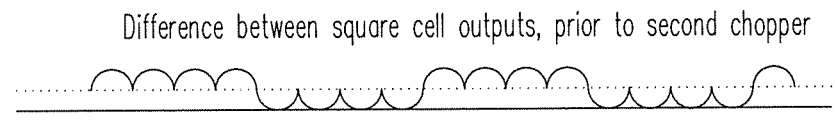
Figure 4H:
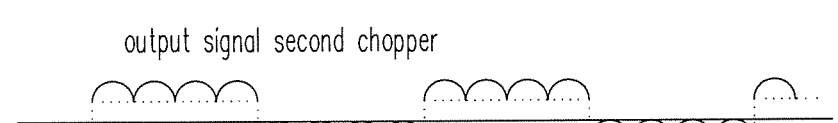

The input chopper of FIG. 3, i.e., switches 308a and 308b, alternates the RF input signal and input reference signal between square cells 307a and 307b. Under this arrangement, when square cell 307a receives RF input signal 301, square cell 307b receives the reference signal 302, and when square cell 307b receives RF input signal 301, square cell 307a receives the reference signal 302. FIGS. 4(a) to 4(h) illustrate the waveforms of various signals in the square cell 300 of FIG. 3. FIG. 4(a) shows RF input signal 301. For simplicity, reference signal 302 is set equal to zero volts (i.e., ground reference) in FIG. 4. Chopper clock signal 310 with controls switches 308a, 308b, 305a and 305b is shown in FIG. 4(b). The output signals of switches 308a and 308b are shown in FIGS. 4(c) and 4(d), respectively. FIGS. 4(e) and 4(f) show the signals at switches 305a and 305b, respectively, after the squaring operations square cells 307a and 307b and including the offsets. FIG. 4(g) shows the difference between the input signals applied to switches 305a and 305b respectively. FIG. 4(h) shows the output signal of difference circuit 309. The difference of the output signals of square cells 307a and 307b has a component that is proportional to the squared result of RF input signal 301, modulated on chopper clock signal 310 (i.e. at a non-zero IF), while the offset introduced by square cells 307a and 307b are located at DC. Thus, after the second chopper (i.e., switches 305a and 305b), the squared signal is down-converted to DC, while the offsets are up-converted by the chopper clock. There are, therefore, two different ways to eliminate the offset. The first way passes a difference of the square cell output signals—prior to the second chopper operation—through a high-pass filter, eliminating the DC offsets while preserving the up-converted signal components. The second way passes an output signal of the second chopper circuit through a low pass filter, thereby suppressing the up-converted offset while passing the down-converted output signal. These approaches may be combined to achieve better offset suppression.

The output signal of the input chopper (i.e., switches 308a and 308b) may contain a component at the chopper frequency that is not proportional to the input signal due to, for example, charge injection in the input switches, or a DC component in the input signal of the chopper. Such components are down-converted by the second chopper (i.e., switches 305a and 305b) and introduce a dynamic offset in the output signal that compromises the dynamic range of the chopper-stabilized square cell. These components may be reduced, for example, by ensuring that the input signal is AC coupled to the input square cell. Alternatively, these components may also be reduced by choosing a chopper frequency that is much lower than the input signal frequency. Under this second way, the direct feed-through can then be eliminated using a high-pass filter of the chopper output signal, thereby suppressing the signal at the chopper frequency, but passing signals within the input frequency plus or minus the chopper frequency. This approach may be implemented in power detectors. A third approach to reducing these components at output terminals of the first choppers (e.g., switches 308a and 308b) is to choose a chopper frequency that is as low as possible, so as to minimize charge injection effects.

A duty cycle different from 50% can cause a residual offset component in the output signal of the chopper-stabilized square cell; if the chopper clock signal has a DC component, not all DC offset components are up-converted to the chopper frequency by the output chopper. A divide-by-2 circuit can provide an effective solution to maintain the 50% duty cycle.

Clock signals with a finite slew-rate may cause the chopper switches to pass slowly through their linear operating region, thus allowing DC offsets to pass through the switches during a portion of the clock cycle. This effect can be eliminated by applying non-overlapping clocks to the output switches (i.e., break-before-make), which ensures that no DC path to the output exists at any instant during the clock cycle. The switches may be controlled at the same frequency, but a phase difference may exist between the control signals applied to the input switches and the control signal applied to the output switch—different combinations of clock signals can be applied to both switches, as illustrated in the article, "Chopper Stabilization of Analog Multipliers, Variable Gain Amplifiers, and Mixers," by Godoy et al., published in the *IEEE Journal of Solid State Circuits*, vol. 43, No. 10, October 2008, pp. 2311-2321.

Simulations based on idealized Verilog models of the square cells and switches have been used to validate the relationships derived previously. In these simulations, which cover chopper frequencies at 0 Hz, 20 MHz and 1 MHz, the input signal frequency was chosen to be an integer multiple of the simulated chopper frequency (e.g., the input signal frequency is selected to be $f_{in}$=100 MHz), except for the case where the chopper frequency is 0 Hz. However, it should be noted that an integer relationship is not required between the chopper frequency and the input frequency for correct chopped square cell operation. The input signal has also a selected bandwidth of 8 MHz. The equivalent input offset in square cell 307a was chosen to be 10 mV, and zero mV in square cell 307b. An output offset current of 10 µA was added at output terminal of square cell 307a. The DC offset component in the input signal to the second chopper (i.e., switch 305a) is suppressed by a DC blocking capacitor. The conversion gains of square cells 307a and 307b are each 300 µA/V² are terminated into 10 kΩ.

Figure 5A:
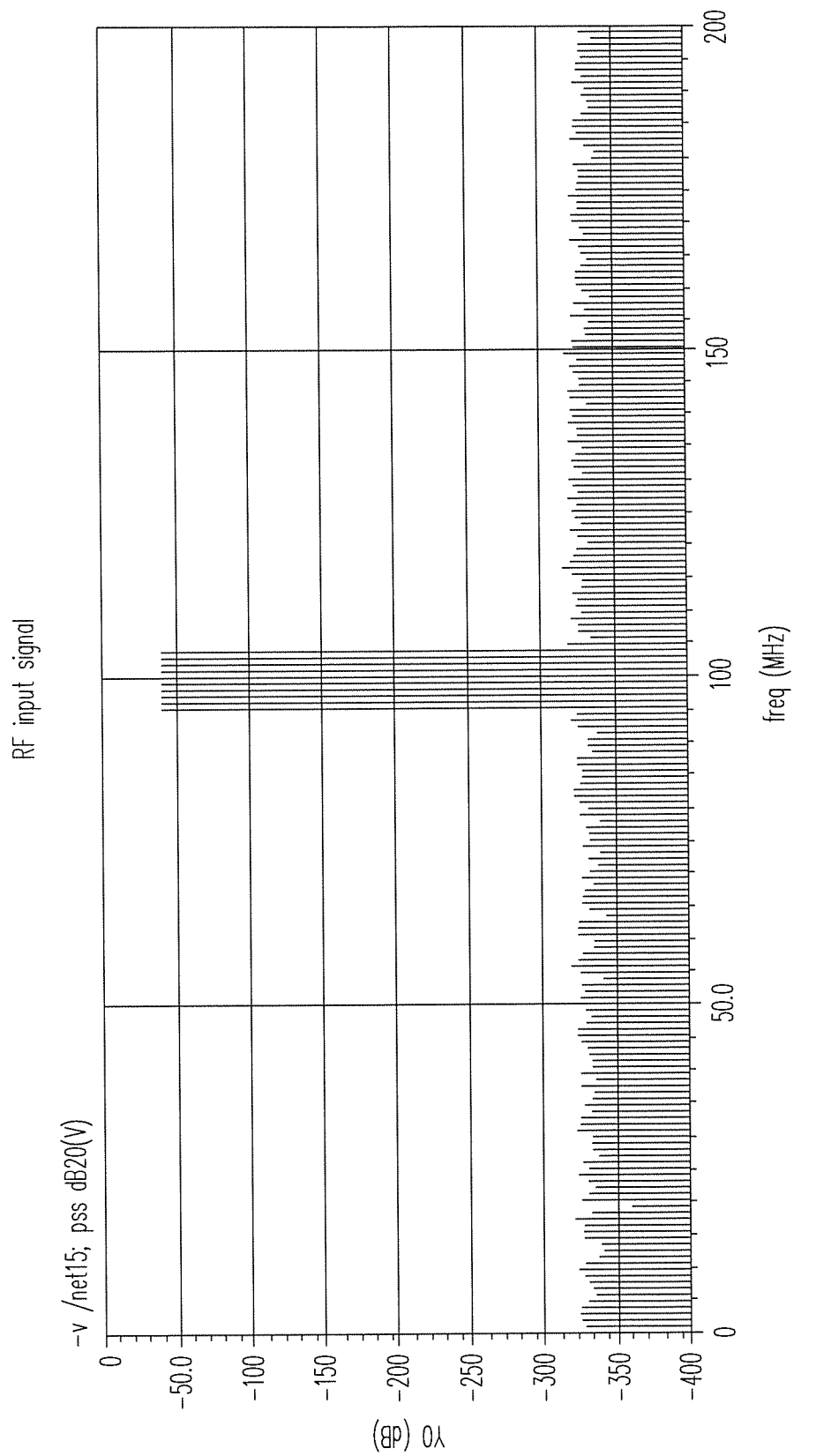
FIGS. 5(a) to 5(g) show the spectra of various signals obtained by simulation of chopper-stabilized square cell 300 of FIG. 3 at a chopper frequency of 0 Hz.
Figure 5B:
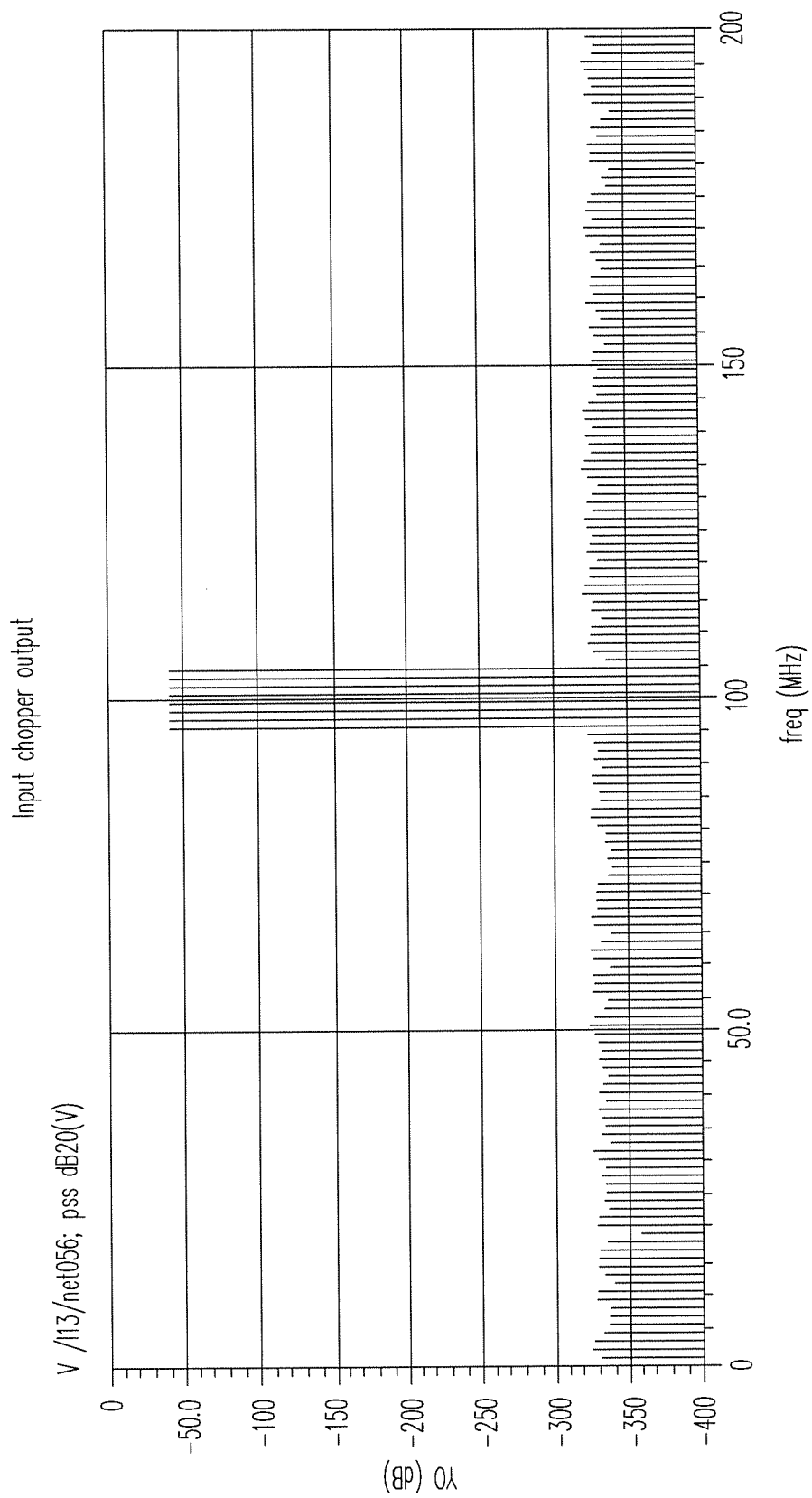
Figure 5C:
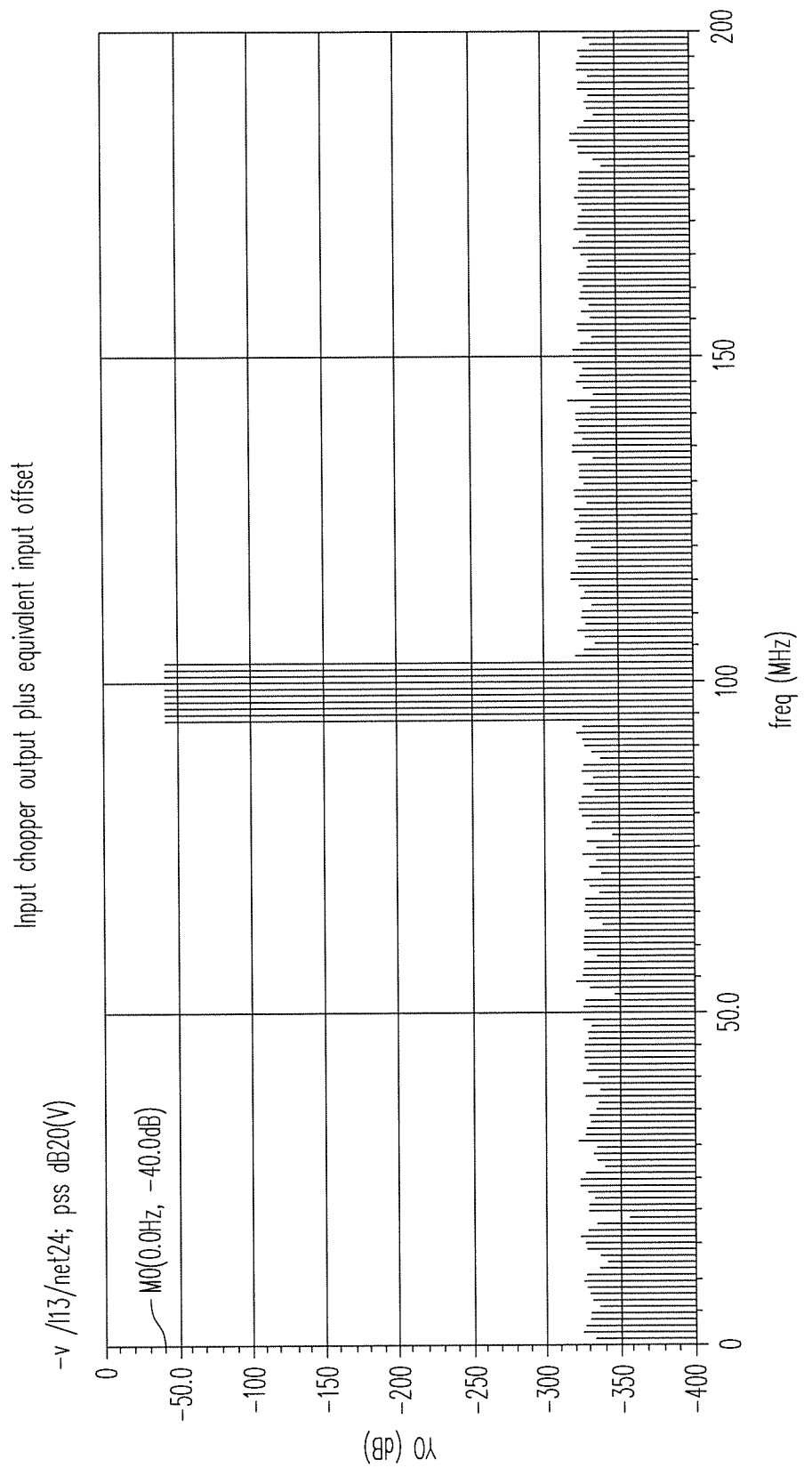
Figure 5D:
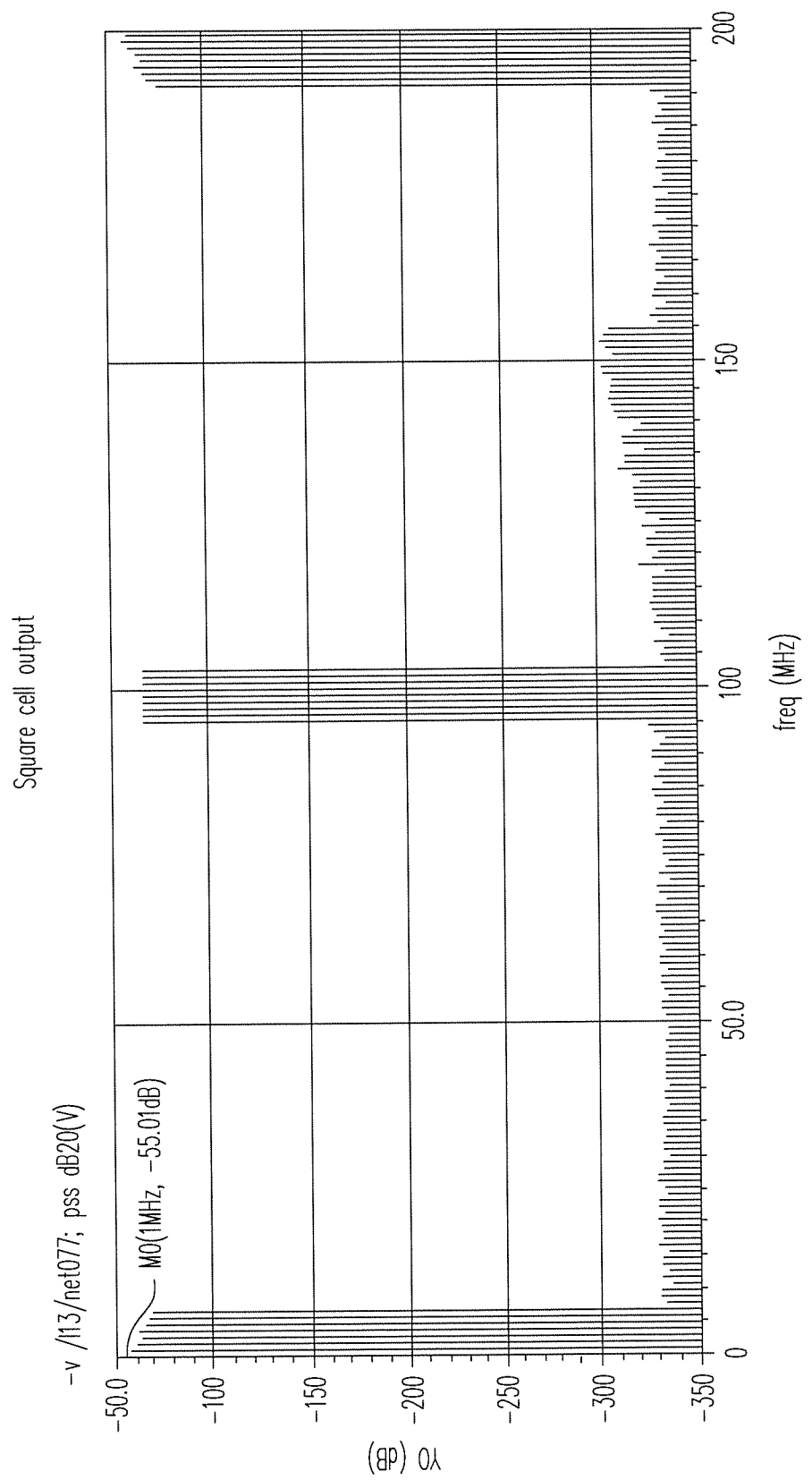
Figure 5E:
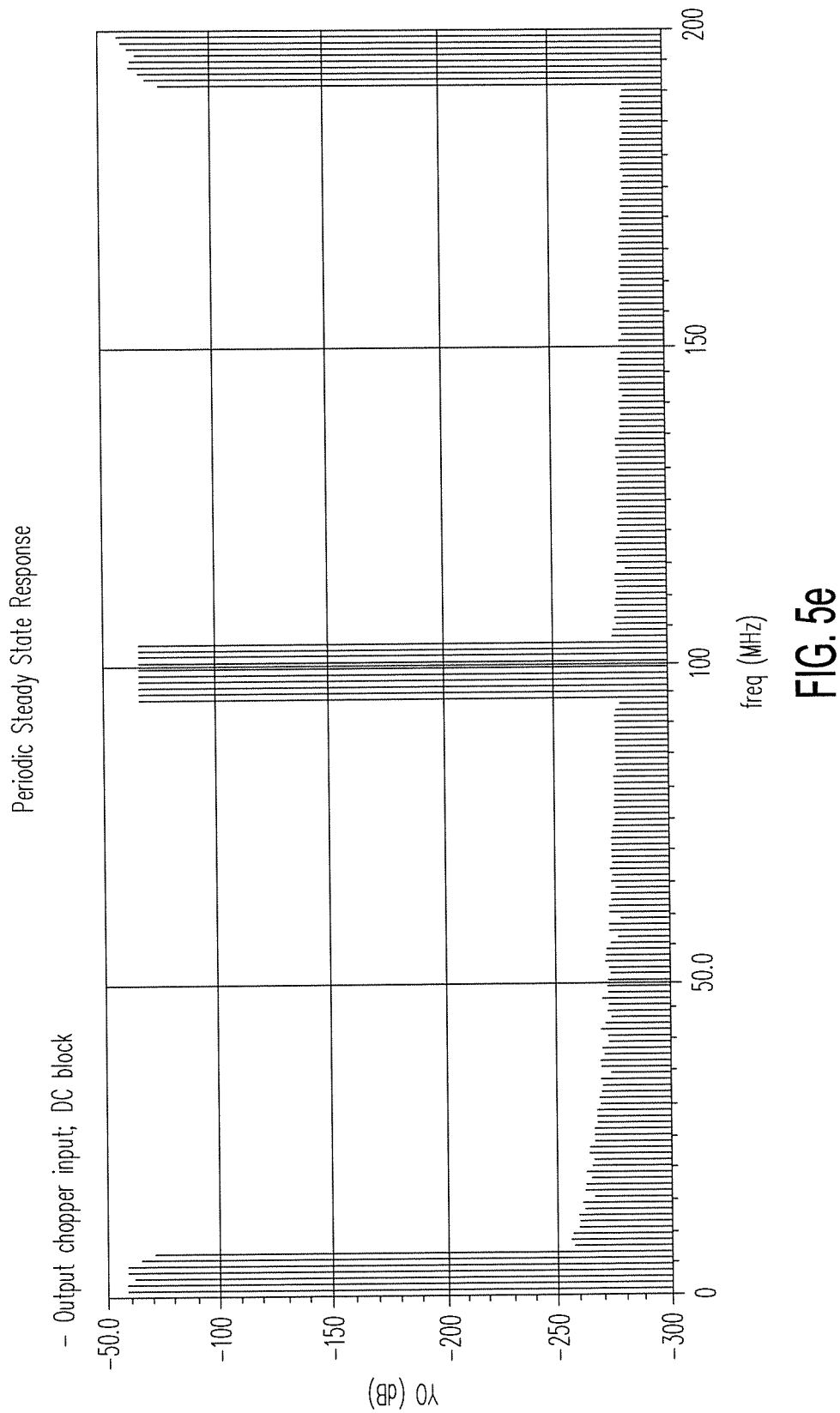
Figure 5F:
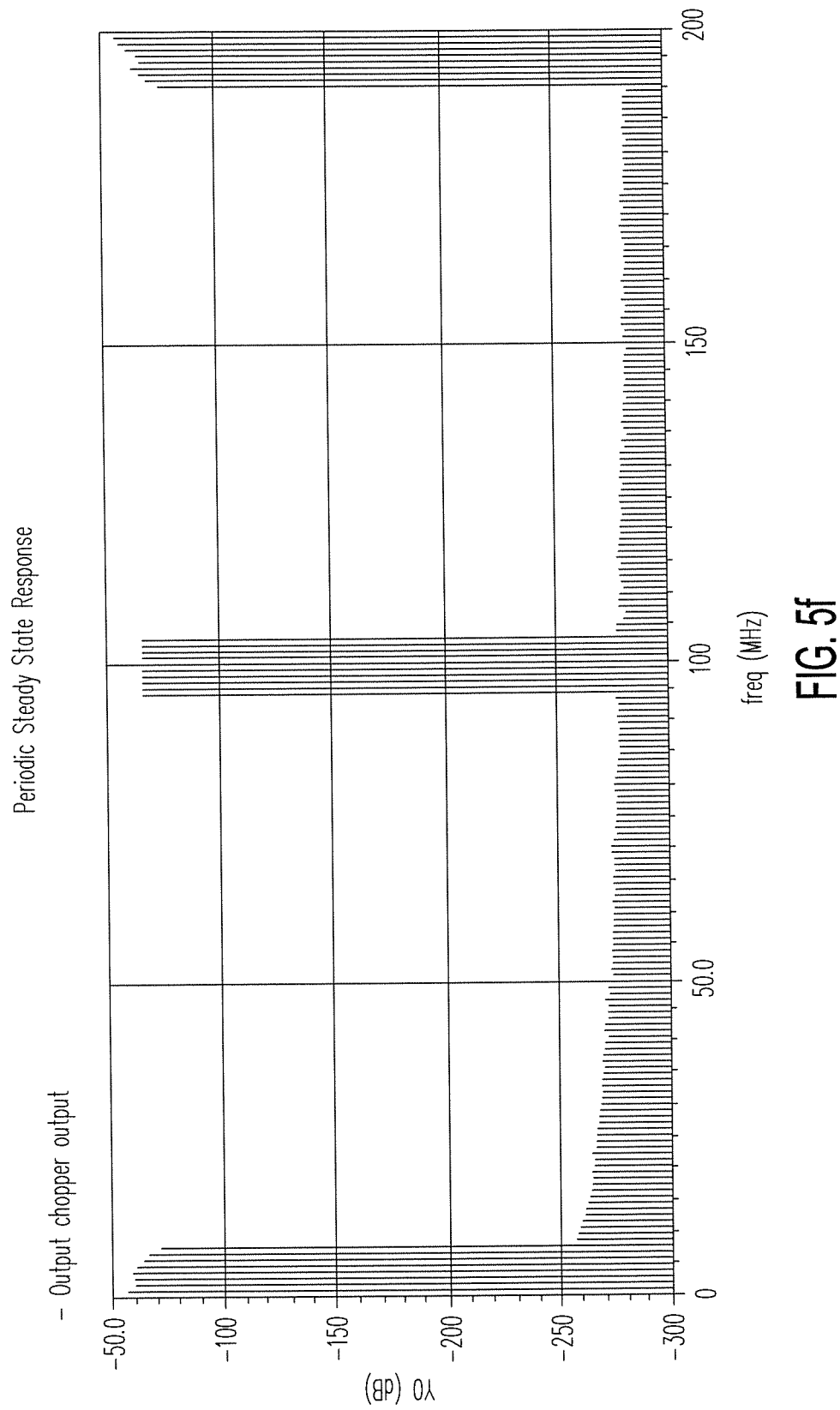
Figure 5G:
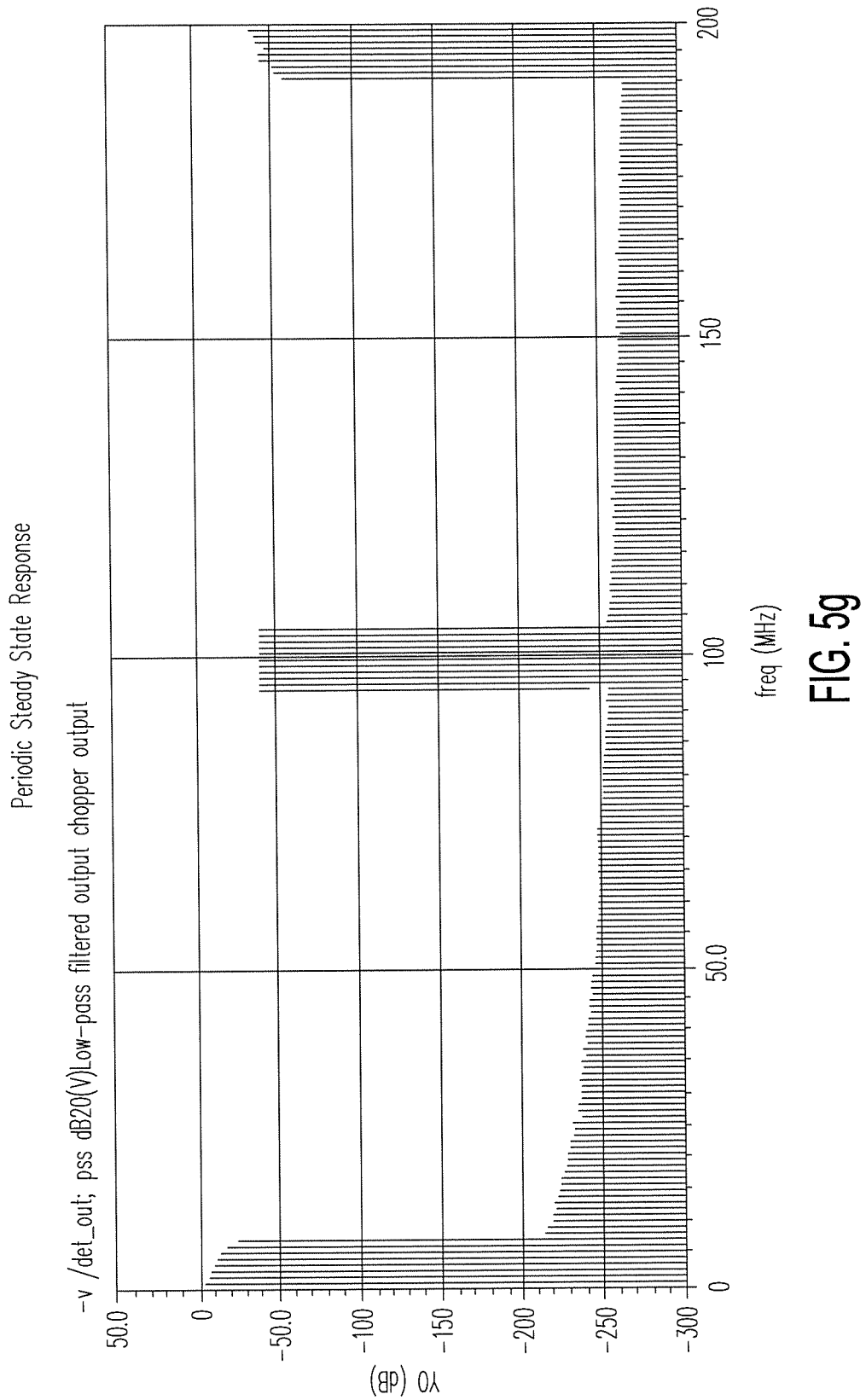

FIGS. 5(a) to 5(g) show the spectra of various signals obtained by simulation of chopper-stabilized square cell 300 of FIG. 3 at a chopper frequency of 0 Hz. FIG. 5(a) show the spectrum of RF input signal 301. FIG. 5(b) show the spectrum of the output signal of switch 308a; at $f_{chop}$=0 Hz, this spectrum is the same as the spectrum for RF input signal 301 shown in FIG. 5(a). FIG. 5(c) shows the spectrum of input signal $X_1$ at the input terminal of square cell 307a, which includes input offset $X_{OS1}$ represented by an impulse at 0 Hz. FIG. 5(d) shows the spectrum of the output signal at the output terminal of square cell 307a, which represent the convolution of the spectra of RF input signal 301 and input offset $X_{OS1}$ with itself. As expected, this spectrum has peaks around f=0 (desired component), f=$f_{RF}$ (cross-term between signal and offset) and f=2 $f_{RF}$ (double frequency term due to the squaring operation). FIG. 5(e) show the spectrum of the output signal at square cell 307a, including an additional output current offset $Y_{OS1}$, which adds an impulse at f=0 that cannot be separated from the input signal. FIG. 5(f) shows the spectrum of the output signal at the output terminal of switch 305a; at $f_{chop}$=0 Hz, this spectrum is the same as the spectrum in FIG. 5(e). FIG. 5(g) shows the spectrum of output signal 305, after low-pass filtering. This reference simulation shows that the output DC offset $Y_{OS1}$ only contributes at DC, while the equivalent input offset $X_{OS1}$ also has a contribution around at $f_{RF}$ (the frequency of RF input signal 301) due to cross-terms.

Figure 6A:
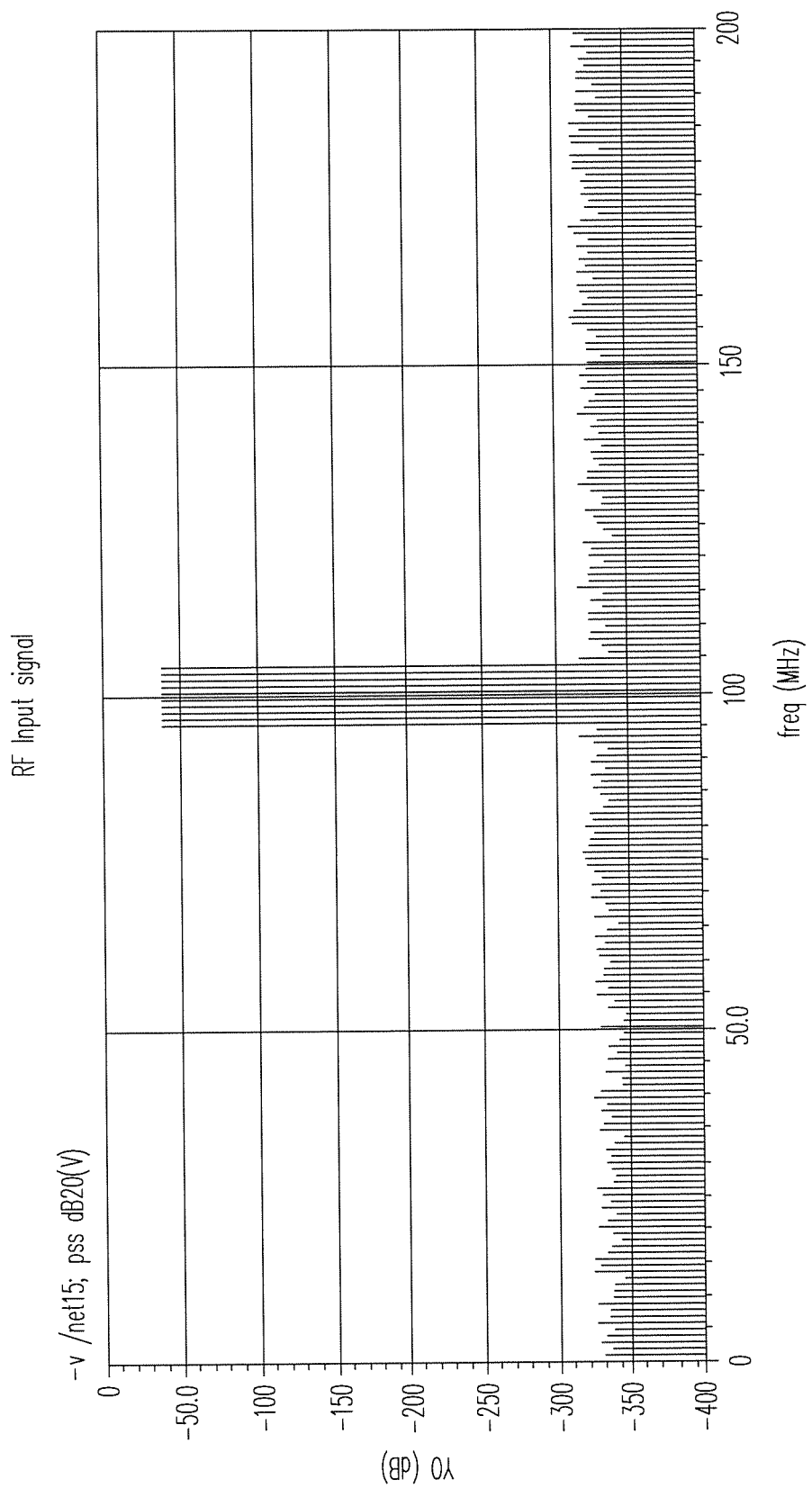
FIGS. 6(a) to 6(g) show the spectra of various signals obtained by simulation of chopper-stabilized square cell 300 of FIG. 3 at a chopper frequency of 20 MHz.
Figure 6B:
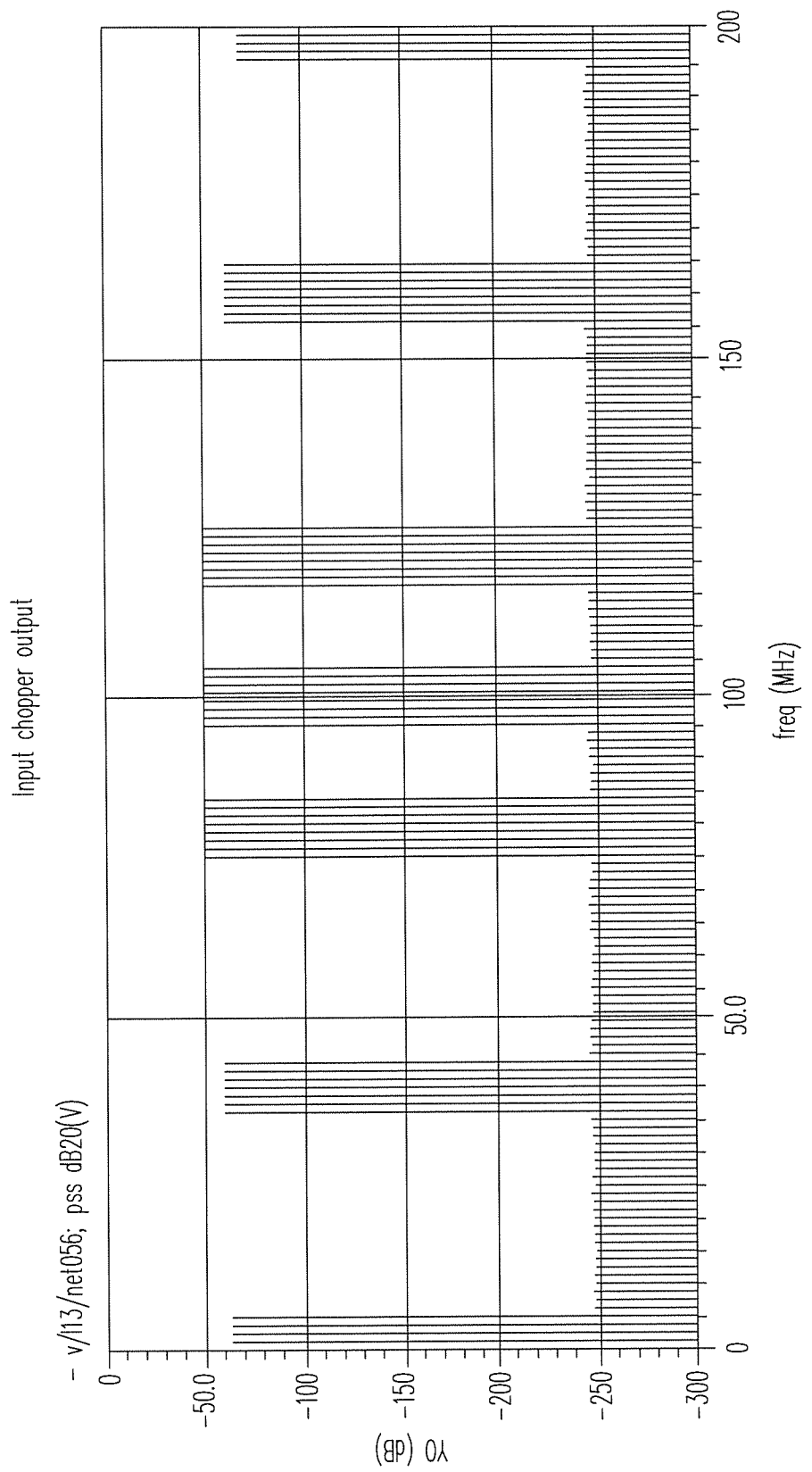
Figure 6C:
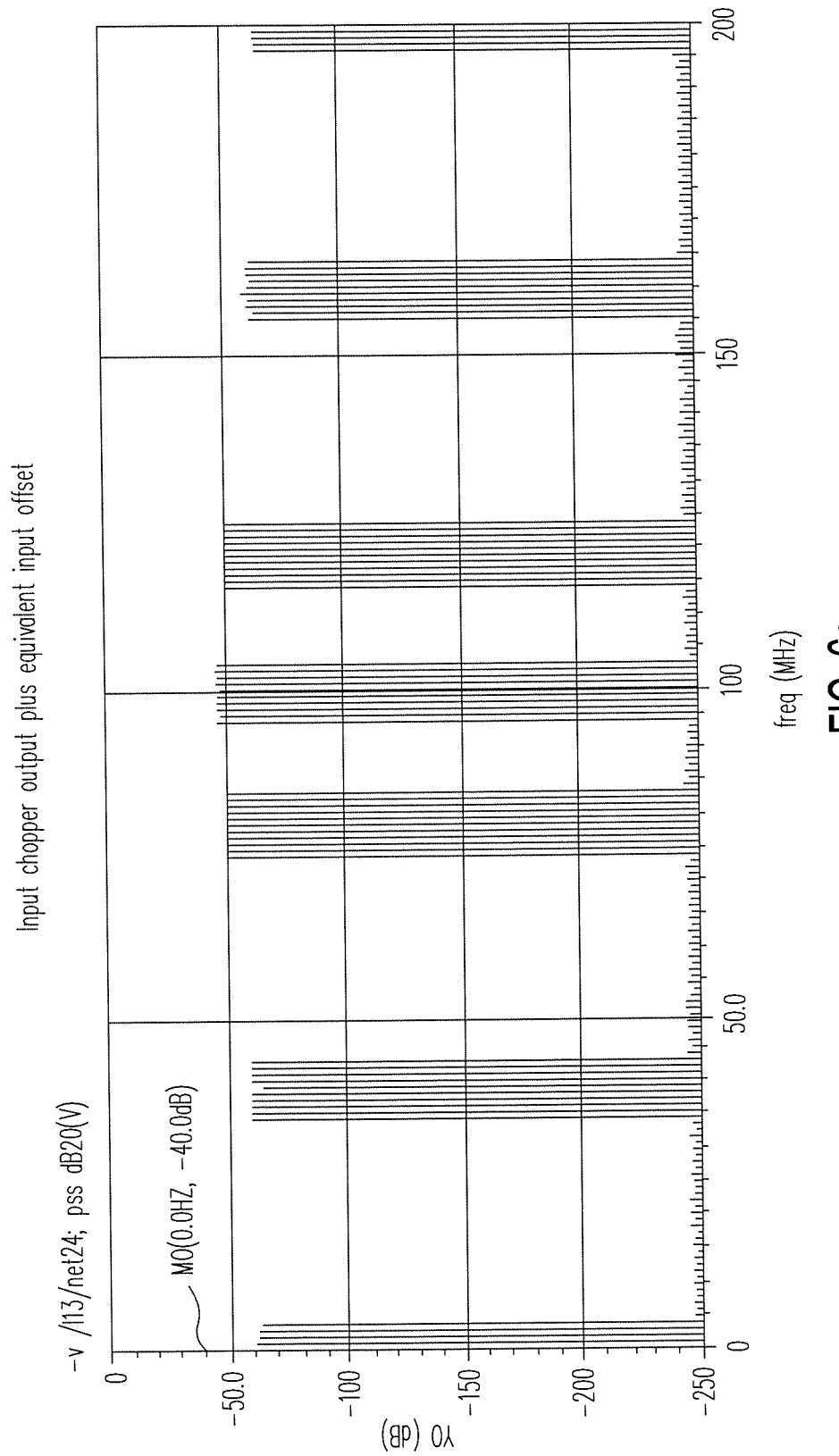

FIGS. 6(a) to 6(g) show the spectra of various signals obtained by simulation of chopper-stabilized square cell 300 of FIG. 3 at a chopper frequency of 20 MHz, which is much higher than the bandwidth of RF input signal 301. FIG. 6(a) show the spectrum of RF input signal 301. FIG. 6(b) show the spectrum of the output signal of switch 308a. FIG. 6(c) shows the spectrum of input signal $X_1$ at the input terminal of square cell 307a, which includes input offset $X_{OS1}$ represented by an impulse at 0 Hz. FIG. 6(c) shows a spectrum that contains side-bands at $\omega_i \pm n\omega_c$, where $\omega_i$ is the center frequency of RF input signal 301 (100 MHz) and $\omega_c$ is the chopper frequency (20 MHz). Since a square wave was used for the chopper, only odd harmonics are present. Because the choppers are turned on and off (rather than the output signal polarity being changed), the DC component in the output signal of the input choppers provides the component at the input signal frequency (100 MHz). Table 1 summarizes the various components of the spectrum of FIG. 6(c):

TABLE 1

| Chopper Signal Harmonics | Lower side-band frequency (MHz) | Upper side-band frequency (MHz) |
|---|---|---|
| 0 | 100 | 100 |
| 1 | 80 | 120 |
| 3 | 40 | 160 |
| 5 | 0 | 200 |
| 7 | −40 | 240 |
| 2n + 1 | $f_{RF} - (2n+1)f_{chop}$ | $f_{RF} + (2n+1)f_{chop}$ |

Figure 6D:
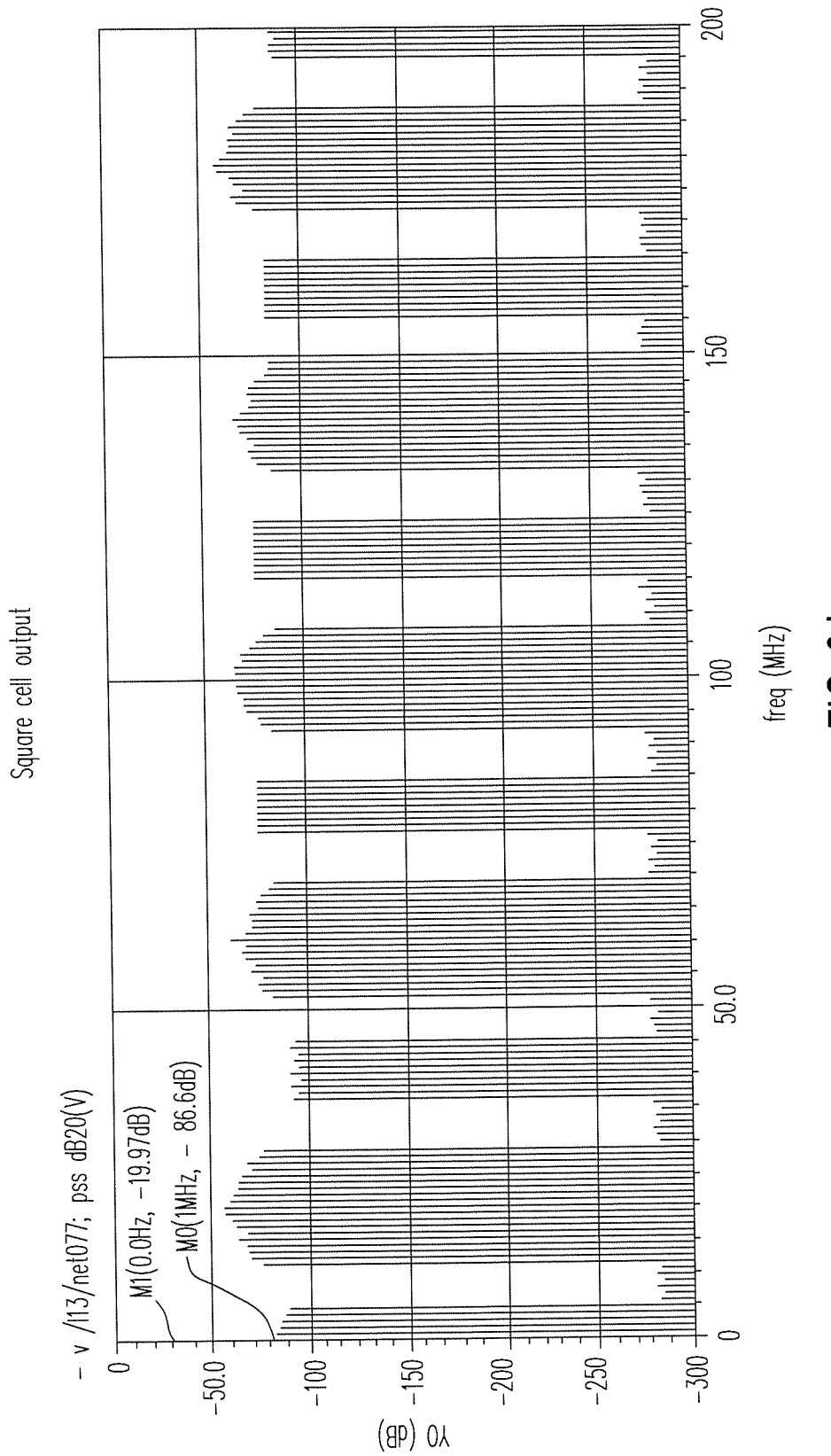

FIG. 6(d) shows the spectrum of the output signal at the output terminal of square cell 307a, which represent the convolution of the spectra of RF input signal 301 and input offset $X_{OS1}$ with itself and each other before output DC offset $Y_{OS1}$ is added. The side-bands of the signal components are twice as wide as the input spectrum shown in FIG. 6(c), due to the squaring operation in square cell 307a, and are centered at the odd harmonics of the chopper frequency. Table 2 summarizes the various side band components in the output spectrum of square cells 307a and 307b depicted in FIG. 6(d), relative to the components found when no chopping is applied (0 Hz). Without chopping, the square cell output spectrum would have components at 0 Hz and at 2× the input frequency (2 $f_{RF}$) of the

TABLE 2

| Chopper Signal Harmonics | Side bands of Component at f = 0 (MHz) | Side bands of Component at f = 2 $f_{RF}$ (MHz) | |
|---|---|---|---|
| 1 | 20 | 180 | 220 |
| 3 | 60 | 140 | 260 |
| 5 | 100 | 100 | 300 |
| 7 | 140 | 60 | 340 |
| 9 | 180 | 20 | 380 |
| 2n + 1 | $(2n+1)f_{chop}$ | $2f_{RF} - (2n+1)f_{chop}$ | $2f_{RF} + (2n+1)f_{chop}$ |

The signal components are located at the odd harmonics of the chopper frequency, thus separated by 2*fchop=40 MHz. In this particular case, the two signal side-bands—one that would be located at 0 Hz without chopping and the other at the second harmonic of RF input signal 301—align, because their separation of 2*$f_{RF}$=200 MHz is an integer multiple of the side-band separation 2*fchop=40 MHz.

The side-bands corresponding to the cross-terms between RF input signal 301 and input offset $X_{OS1}$ are located at the odd harmonics of the chopper frequency, centered at the center frequency of RF input signal 301, as shown in Table 3. The side-bands are copies of the spectrum of RF input signal 301, scaled by the magnitude of output offset $Y_{OS1}$.

TABLE 3

| Chopper Signal Harmonics | Lower side-band frequency (MHz) | Upper side-band frequency (MHz) |
|---|---|---|
| 1 | 80 | 120 |
| 3 | 40 | 160 |
| 5 | 0 | 200 |
| 7 | −40 | 240 |
| 2n + 1 | $f_{RF} - (2n+1)f_{chop}$ | $f_{RF} + (2n+1)f_{chop}$ |

In this simulation, the center frequency of RF input signal, the cross-product of RF input signal 301 and input offset $X_{OS1}$ coincide with the even harmonics of the chopper frequency. It is thus desirable that the center frequency of RF input signal 301 is considerably higher than the chopper frequency; this will significantly reduce the magnitude of any cross-product terms that land at the primary signal component (at fchop=20 MHz).

Figure 6E:
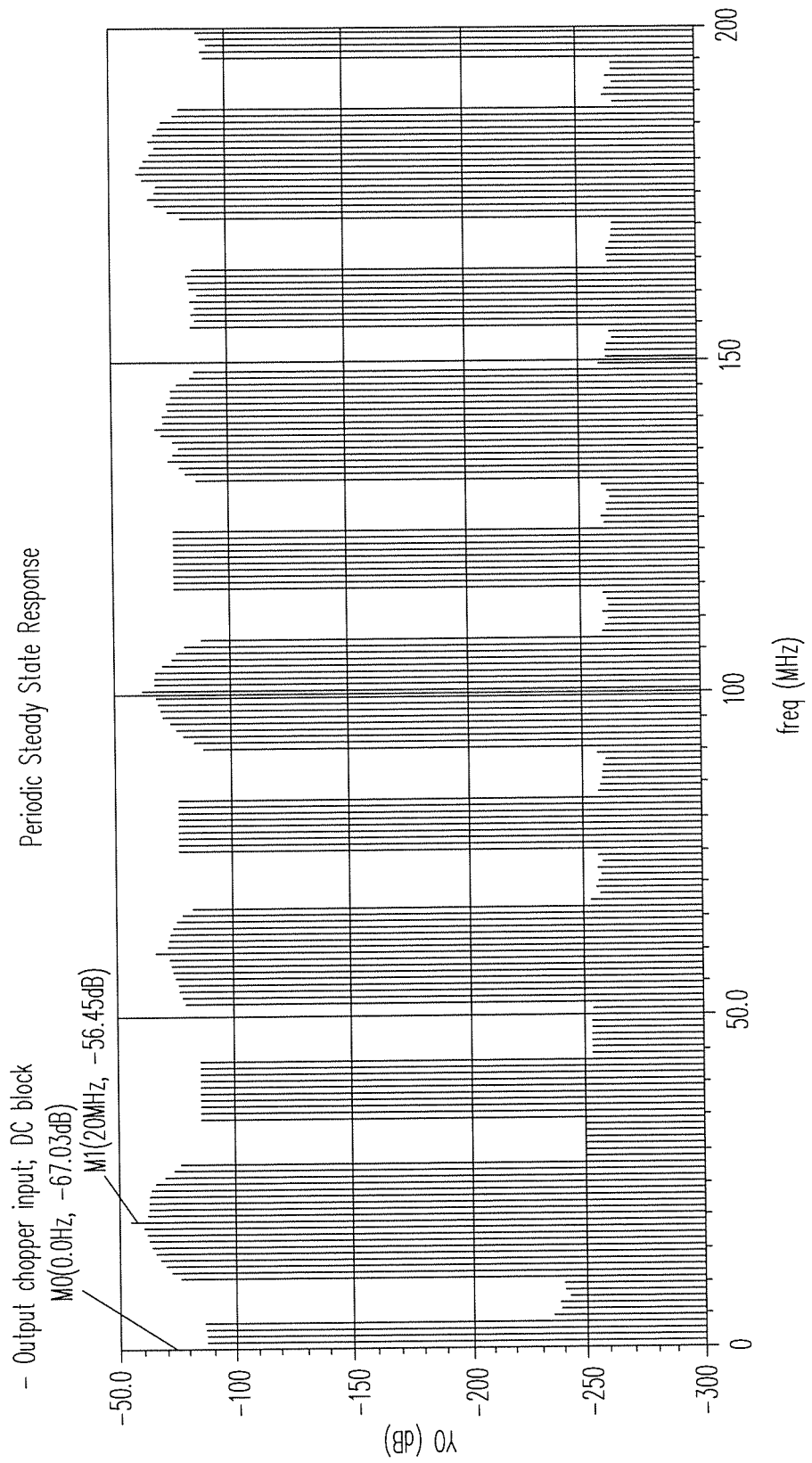
Figure 6F:
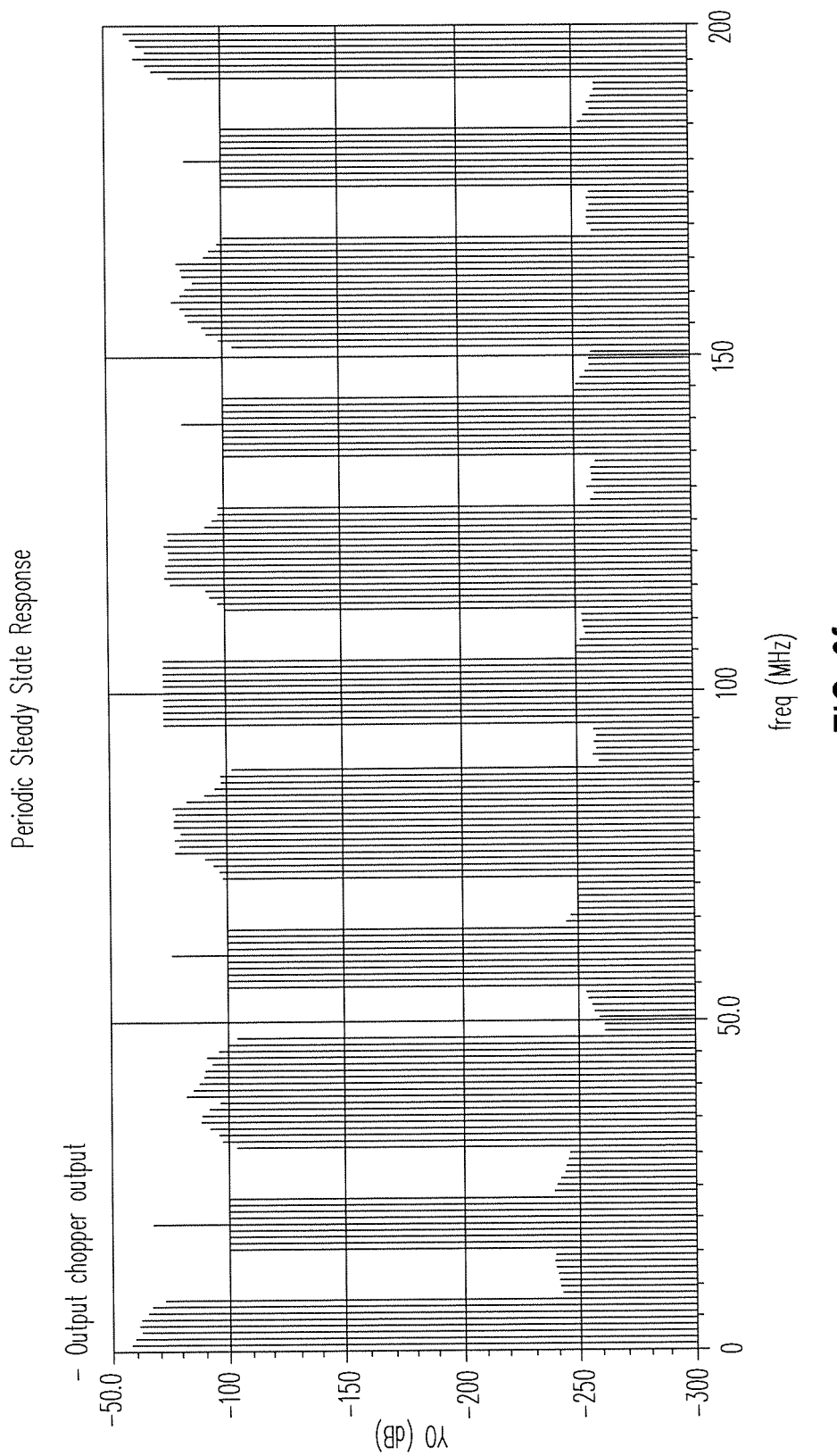

FIG. 6(e) show the spectrum of the output signal at square cell 307a, including an additional output current offset $Y_{OS1}$. FIG. 6(f) shows the spectrum of the output signal at the output terminal of switch 305a. Ideally, the signal spectrum of FIG. 6(f) only has components at DC and not at higher harmonics of RF input signal 301. However, if the chopper signal is not ideally square, some higher harmonic components would remain present. Table 4 shows the signal components of the output signal at switch 305a:

TABLE 4

| Chopper Signal Harmonics | Side bands of Component at f = 0 (MHz) | Side bands of Component at f = 2 $f_{RF}$ (MHz) | |
|---|---|---|---|
| 0 | 0 | 200 | 200 |
| 2 | 40 | 160 | 240 |
| 4 | 80 | 120 | 280 |
| 6 | 120 | 80 | 320 |
| 8 | 160 | 40 | 360 |
| 10 | 200 | 0 | 400 |
| 2n | $2nf_{chop}$ | $2f_{RF} - 2nf_{chop}$ | $2f_{RF} + 2nf_{chop}$ |

Figure 6G:
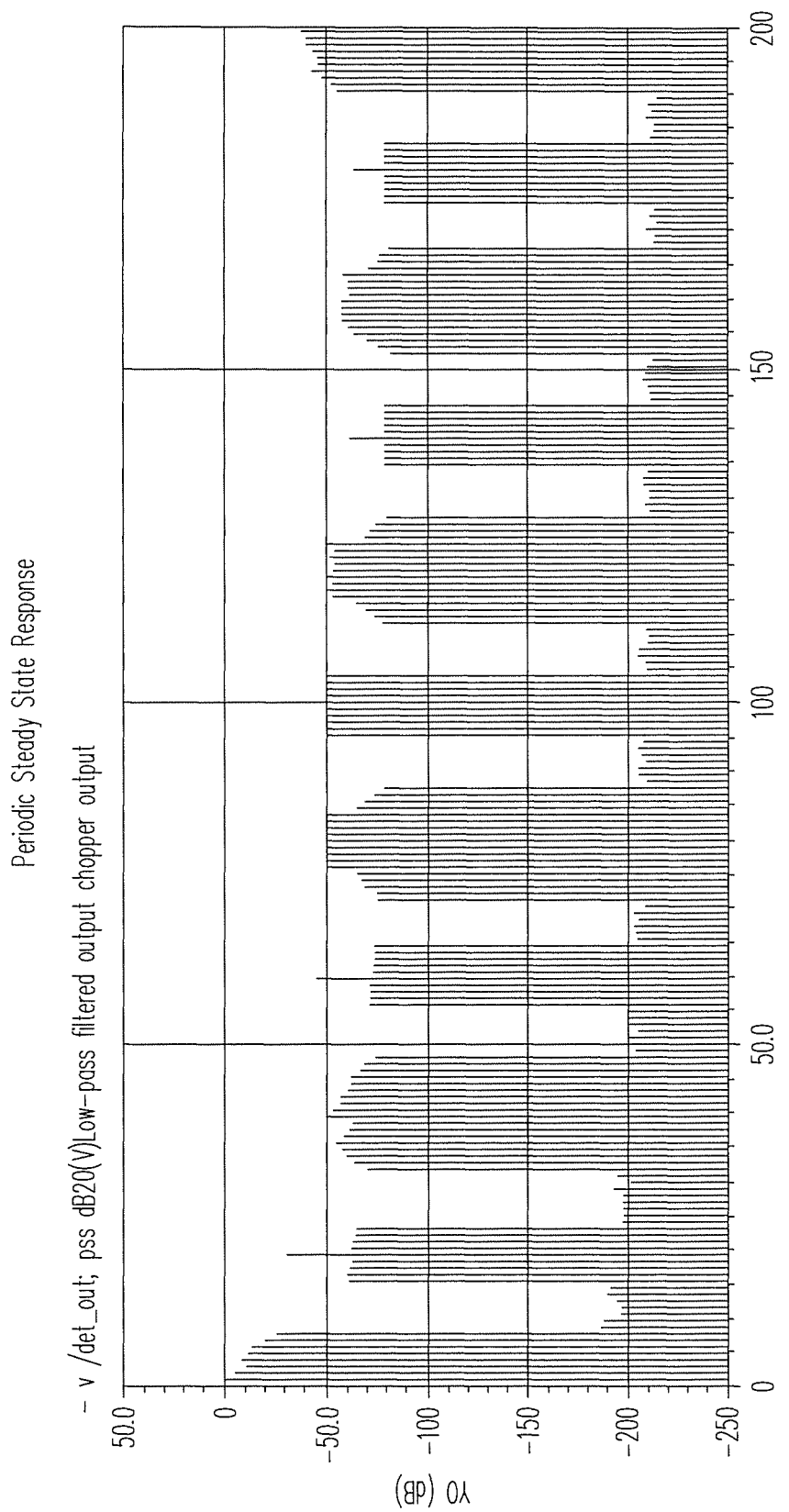
Figure 7A:
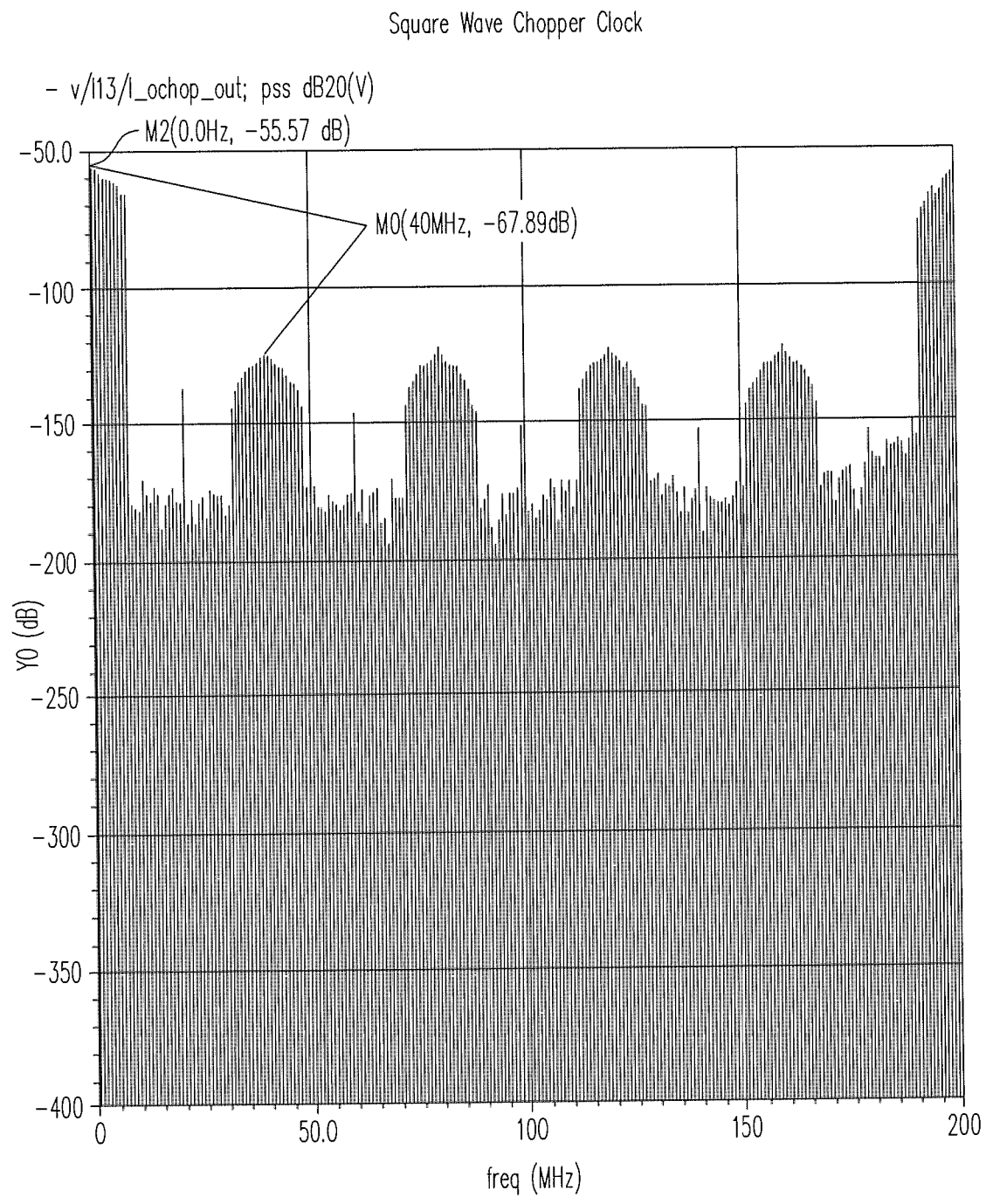
FIGS. 7(a) and 7(b) show the output spectra of the output signal of switch 305a, when chopper clock signal 310 is a square wave and when chopper clock signal 310 is sinusoidal, respectively.
Figure 7B:
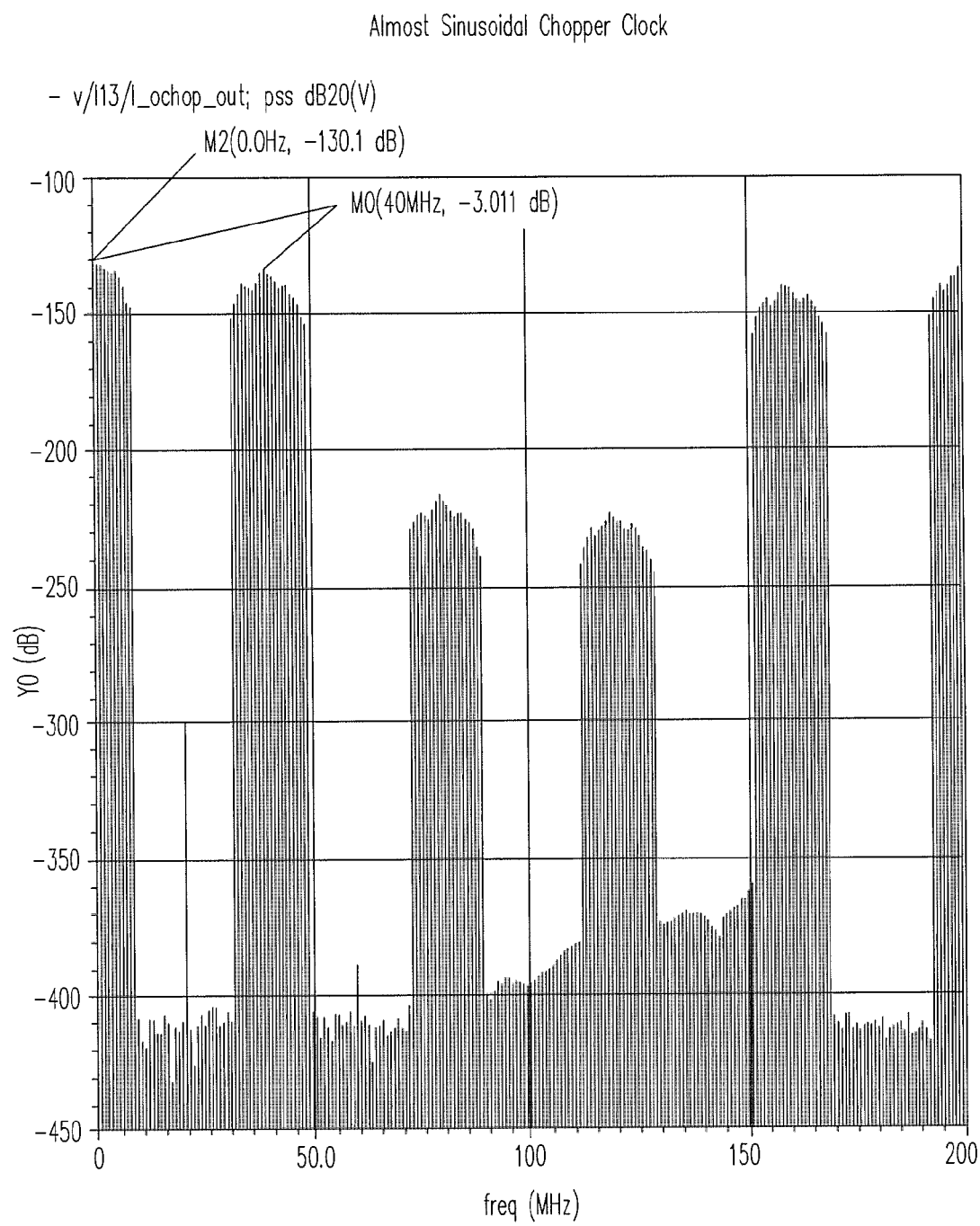

FIG. 6(g) shows the spectrum of output signal 305, after low-pass filtering. FIGS. 7(a) and 7(b) show the output spectra of the output signal of switch 305a, when chopper clock signal 310 is a square wave and when chopper clock signal 310 is sinusoidal, respectively; the higher harmonics of RF input signal 301 diminish when the chopper signal approaches a square wave. As shown in FIG. 7(b), a strong signal side band around the second harmonic of the chopper frequency is present (only 3 dB below the side-band at DC) in the sinusoidal case. As shown in FIG. 7(a), the side band around the second harmonic of the chopper frequency (40 MHz) is largely suppressed (by almost 68 dB) in the square wave case.

Figure 8A:
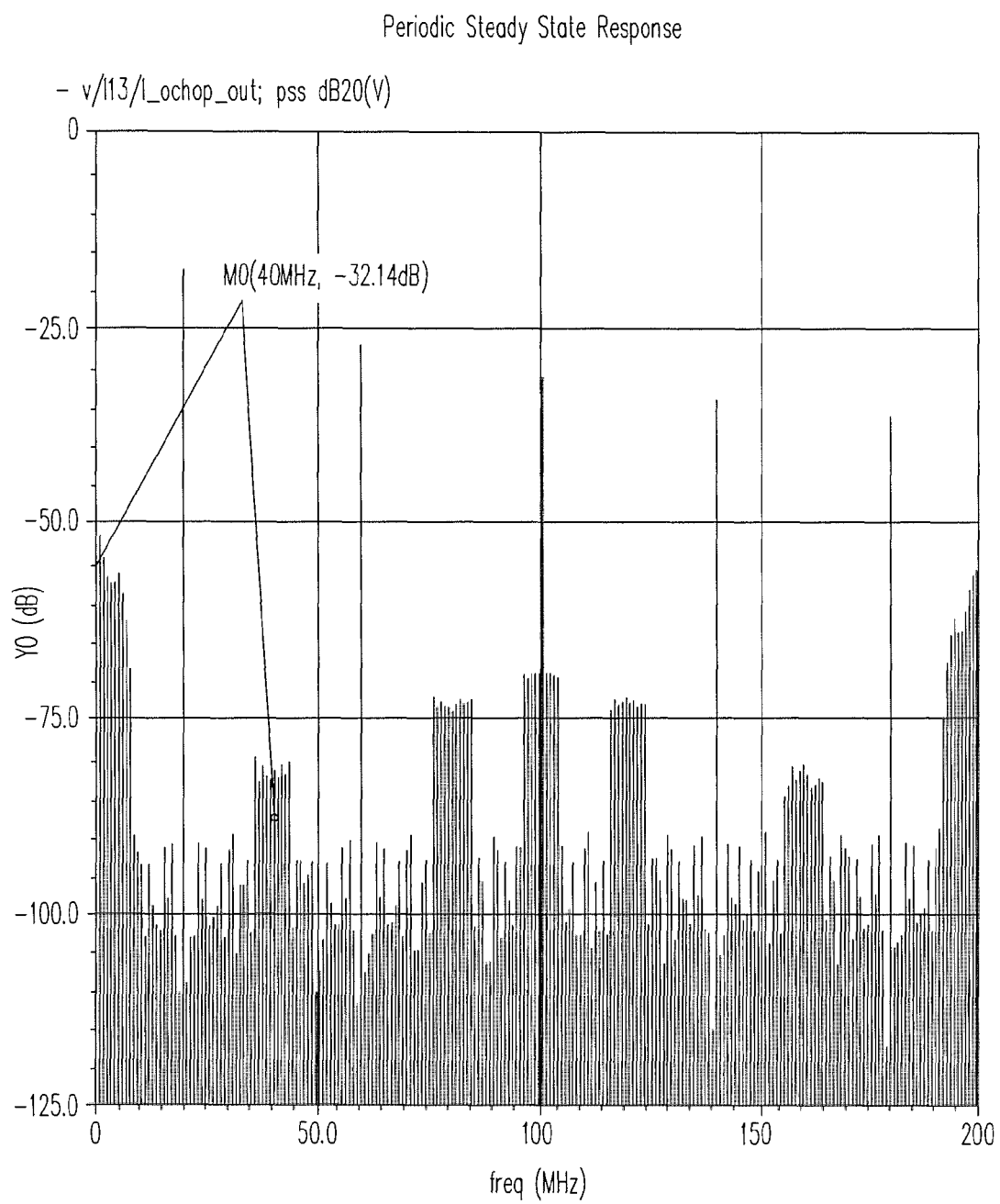
FIGS. 8(a) and 8(b) show the spectra of the input signal of switch 305a without a DC blocking capacitor and with the DC blocking capacitor, respectively.
Figure 8B:
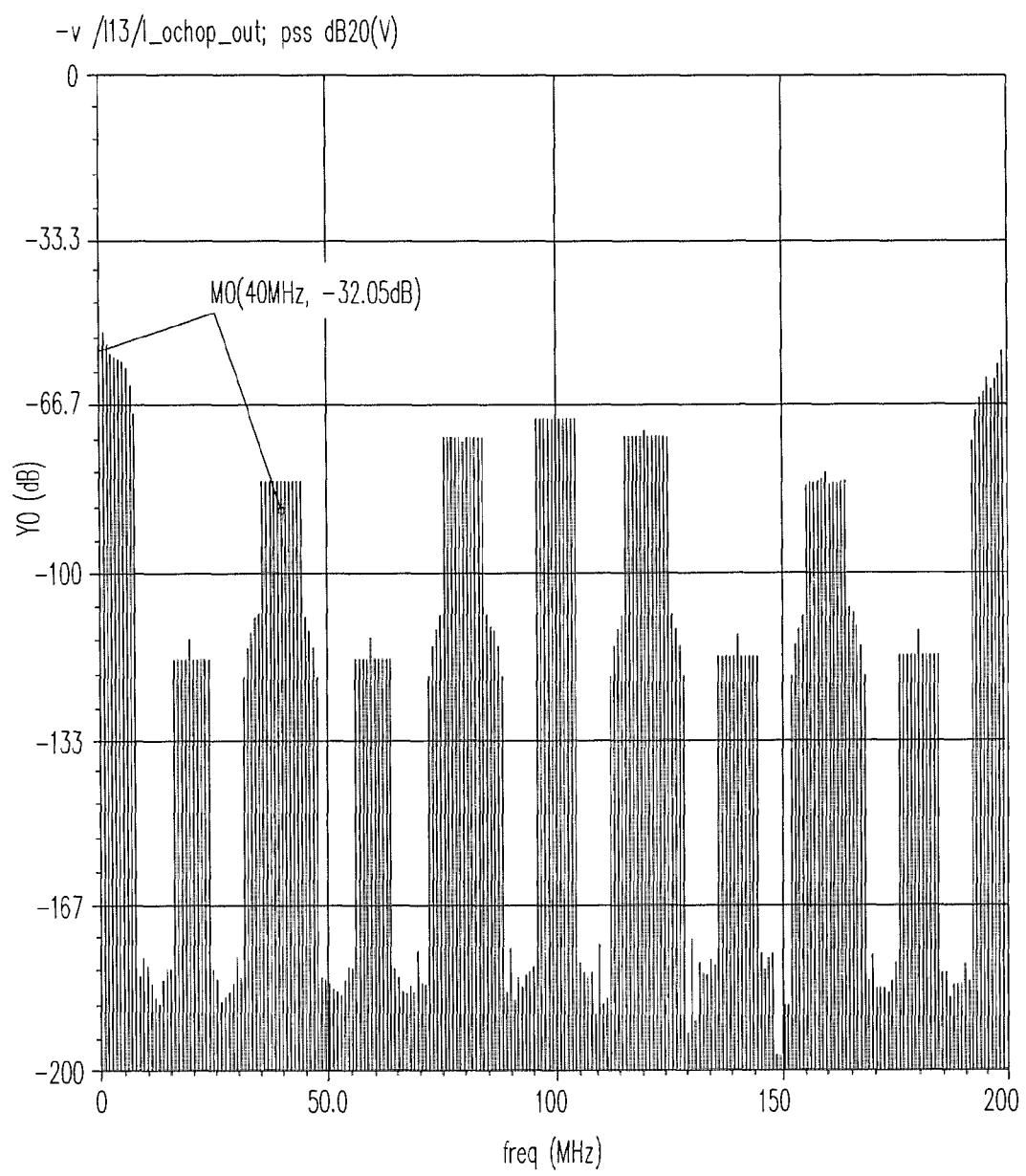

As explained above, the DC offset component in the input signal to the second chopper (i.e., switch 305a) is suppressed by a DC blocking capacitor. FIGS. 8(a) and 8(b) show the spectra of the input signal of switch 305a without a DC blocking capacitor and with the DC blocking capacitor, respectively. As shown in FIG. 8(a) the offsets cause large spikes at the harmonics of the chopper frequency, resulting in significant ripples. The DC blocking capacitor helps to reduce these ripples.

Figure 9A:
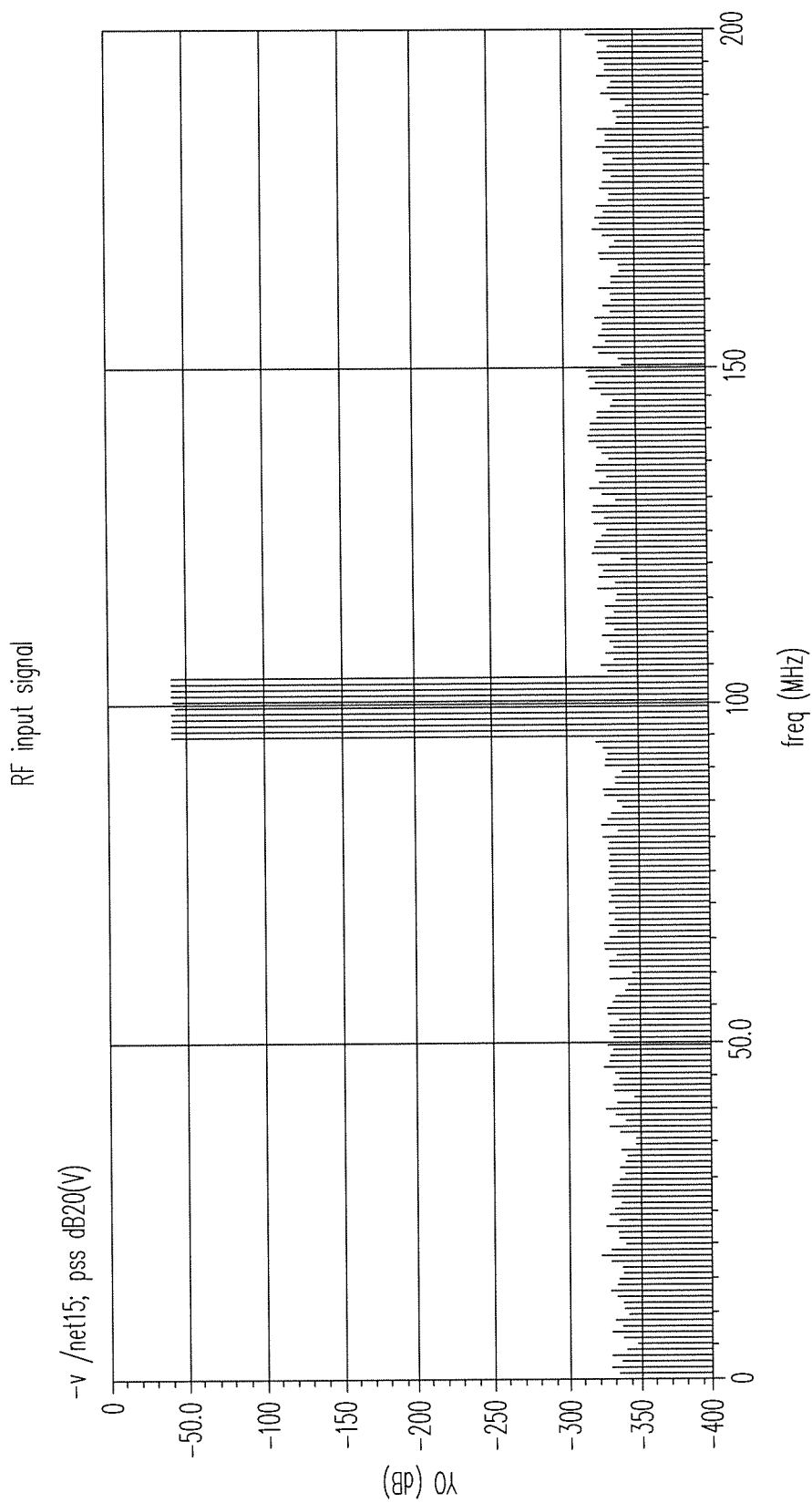
FIGS. 9(a) to 9(g) show the spectra of various signals obtained by simulation of chopper-stabilized square cell 300 of FIG. 3 at a chopper frequency of 1 MHz.
Figure 9B:
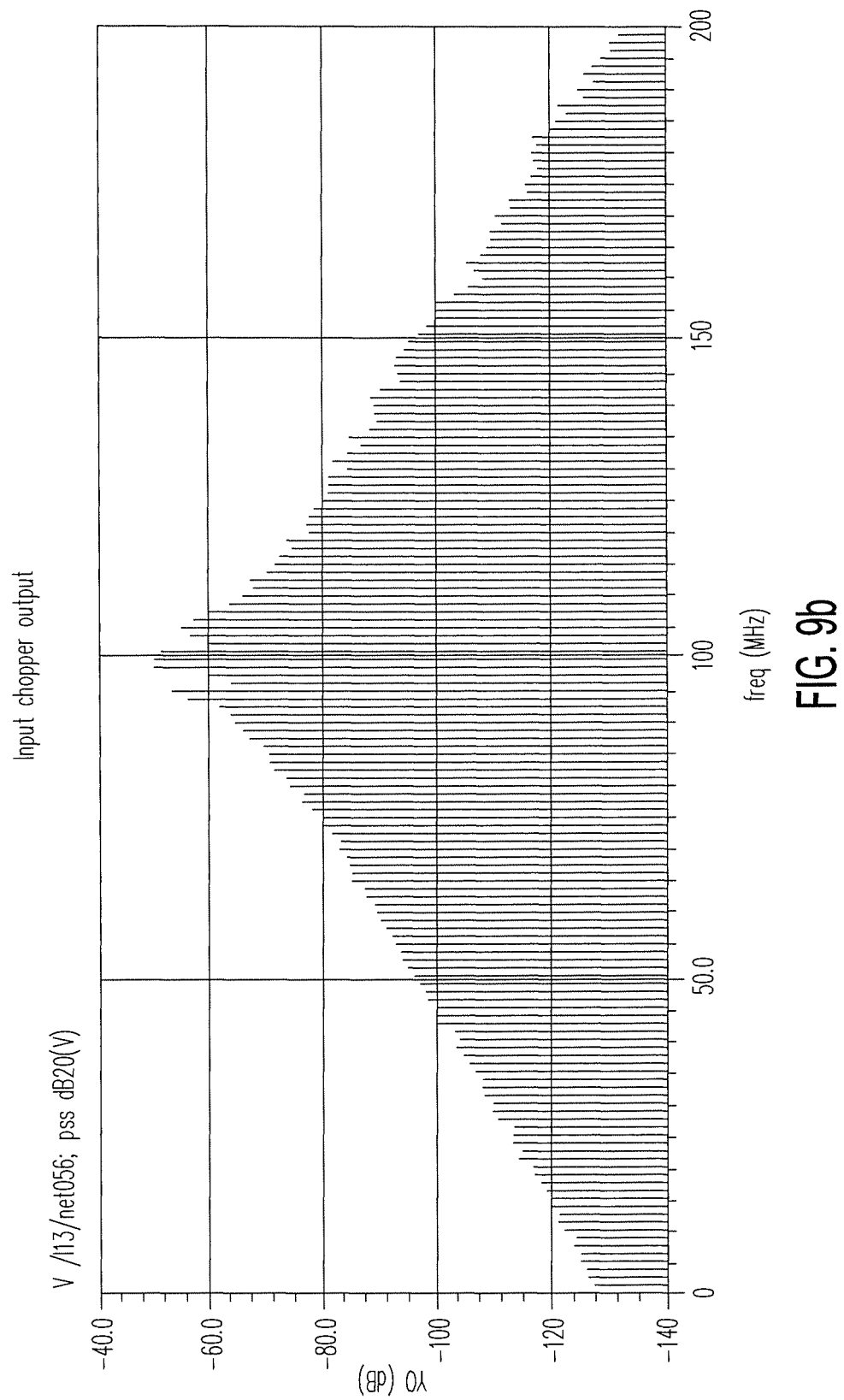
Figure 9C:
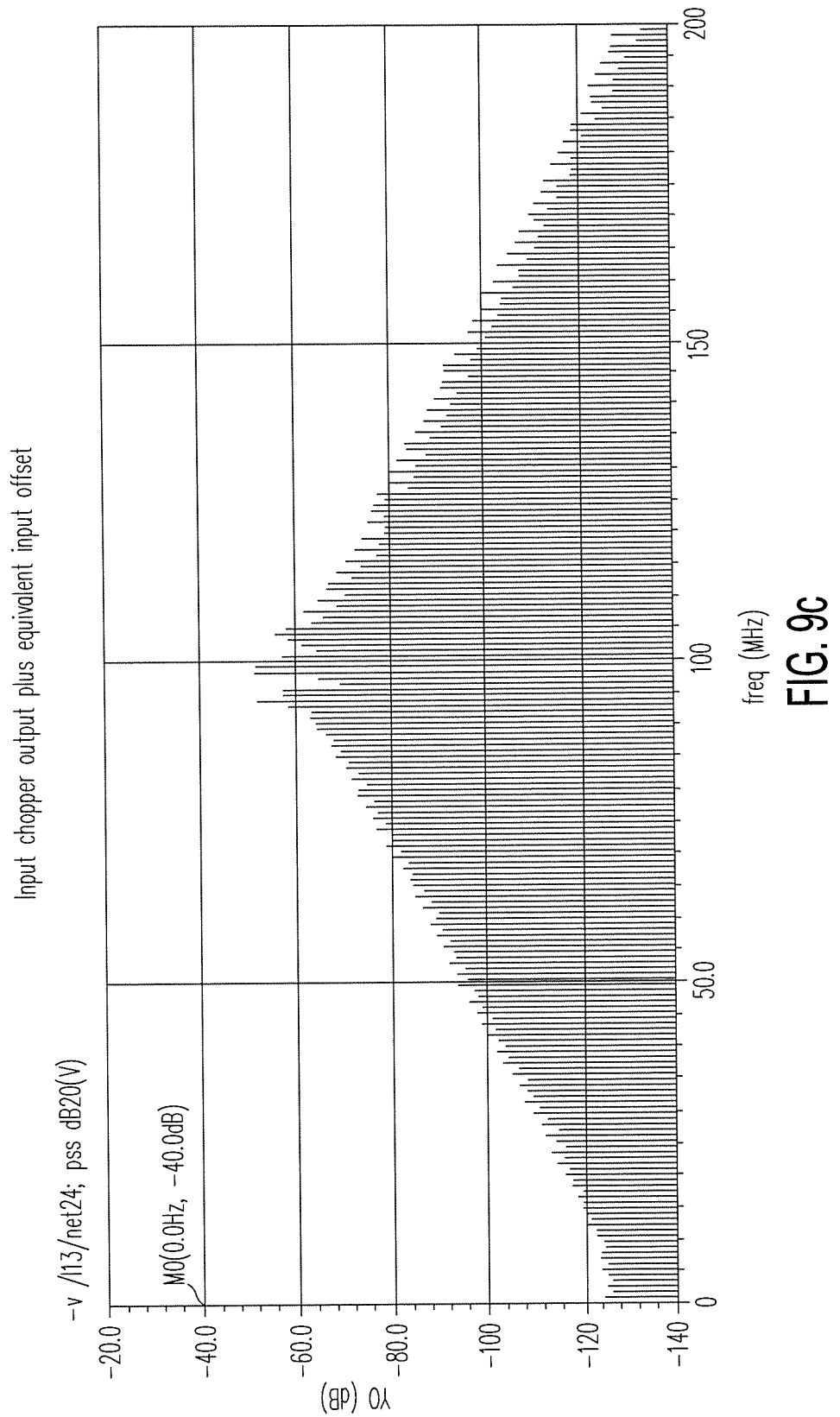
Figure 9D:
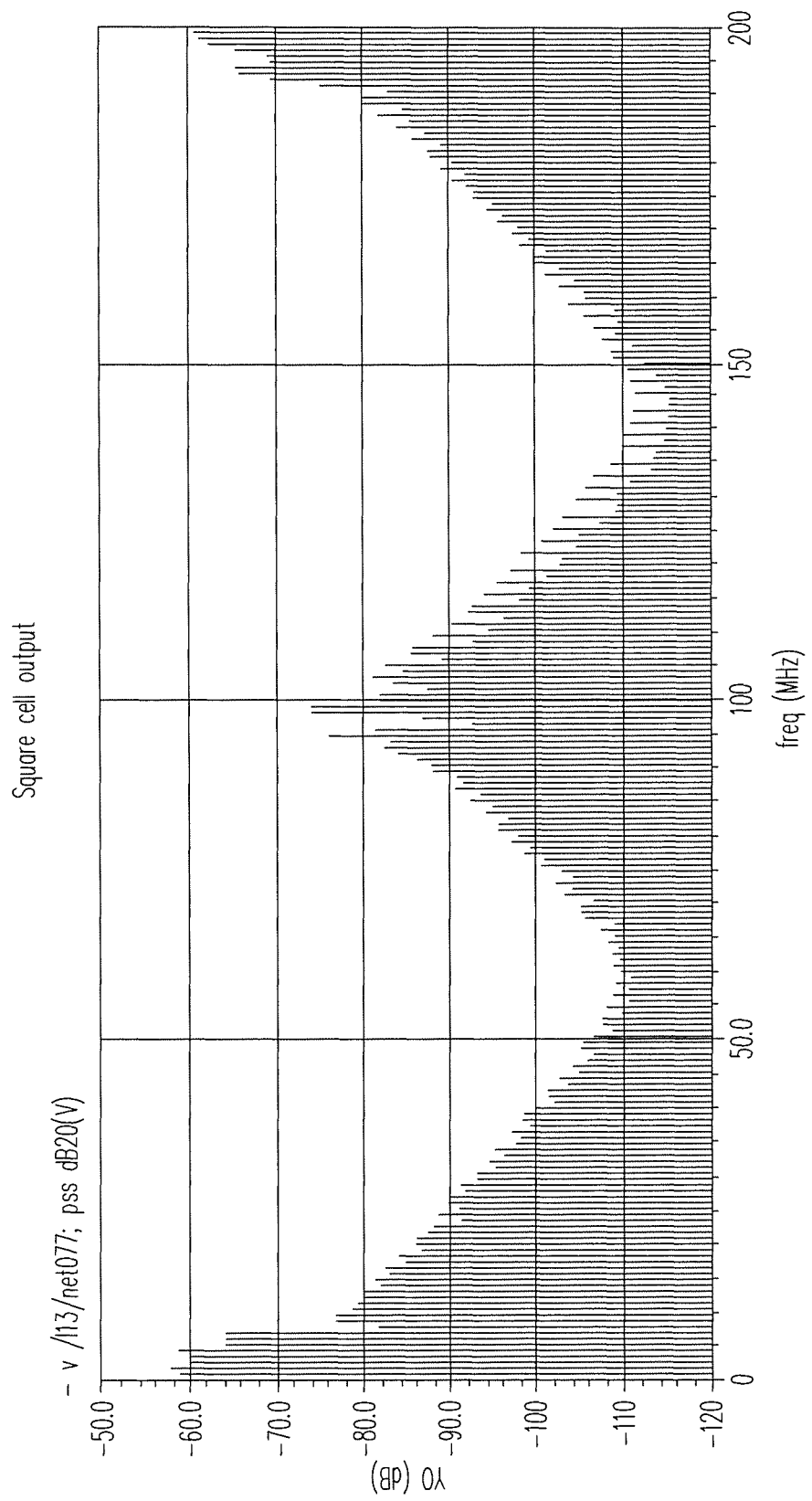

FIGS. 9(a) to 9(g) show the spectra of various signals obtained by simulation of chopper-stabilized square cell 300 of FIG. 3 at a chopper frequency of 1 MHz. FIG. 9(a) show the spectrum of RF input signal 301. FIG. 9(b) show the spectrum of the output signal of switch 308a. FIG. 9(c) shows the spectrum of input signal $X_1$ at the input terminal of square cell 307a, which includes input offset $X_{OS1}$ represented by an impulse at 0 Hz. As shown in FIG. 9(c), the side-bands of chopped RF input signal 301 are aliasing with RF input signal 301, resulting in—on a logarithmic scale—an almost triangular shaped input spectrum. FIG. 9(d) shows the spectrum of the output signal at the output terminal of square cell 307a. As shown in FIG. 9(d), a copy of the output signal is seen centered at f=100 MHz, which is shifted to DC by the second chopper operation (i.e., by the actions of switches 305a and 305b).

Figure 9E:
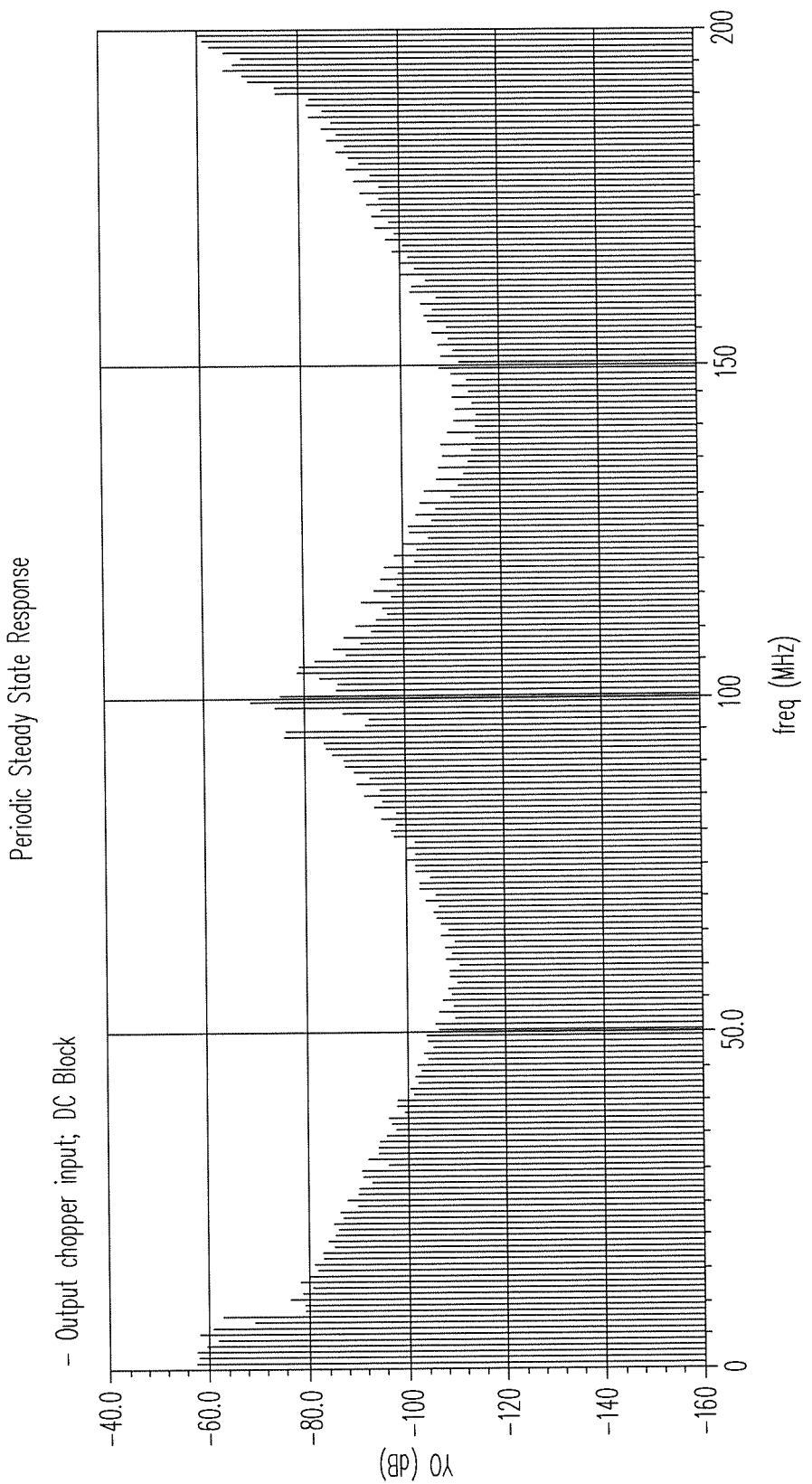
Figure 9F:
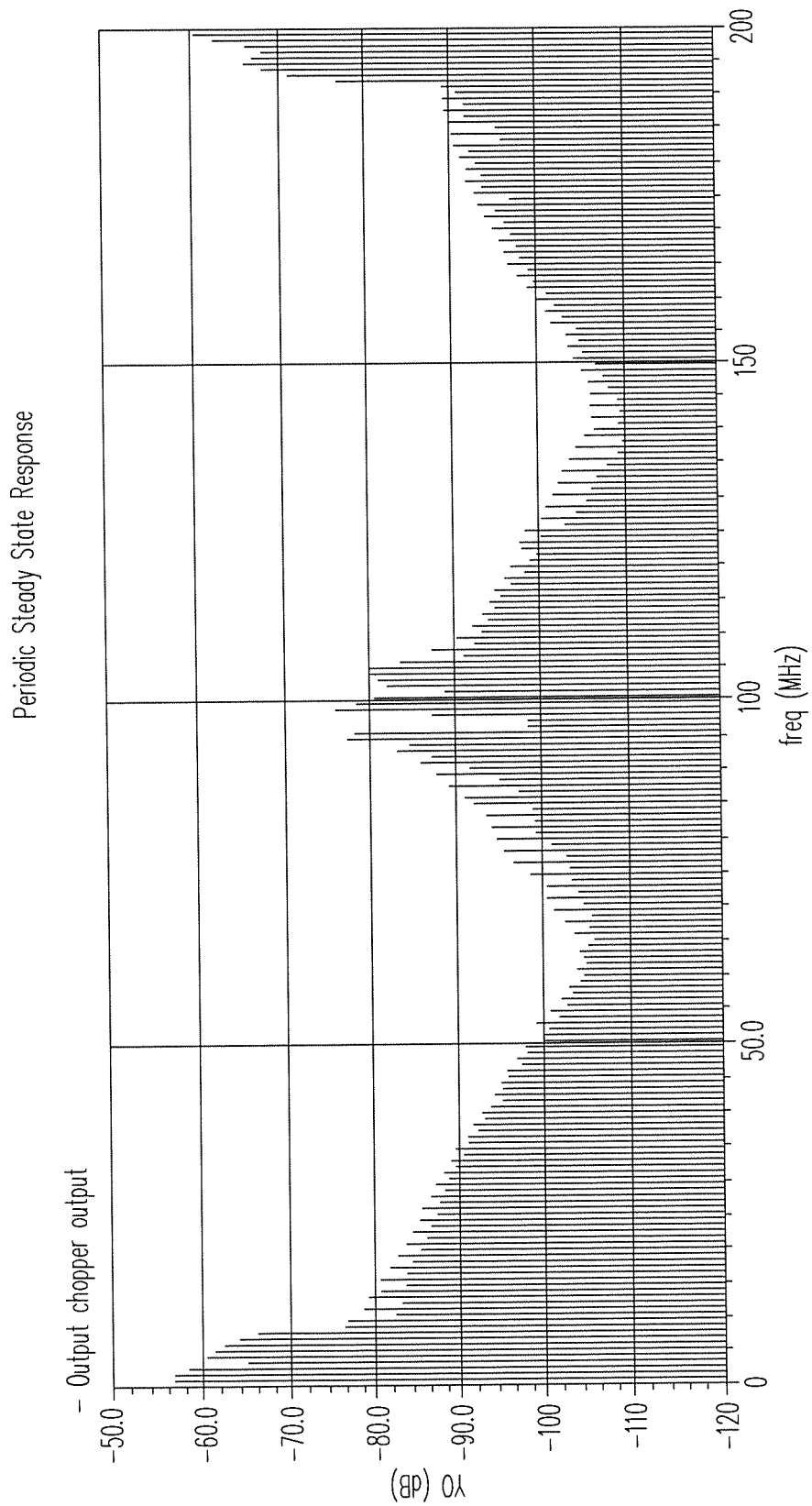
Figure 9G:
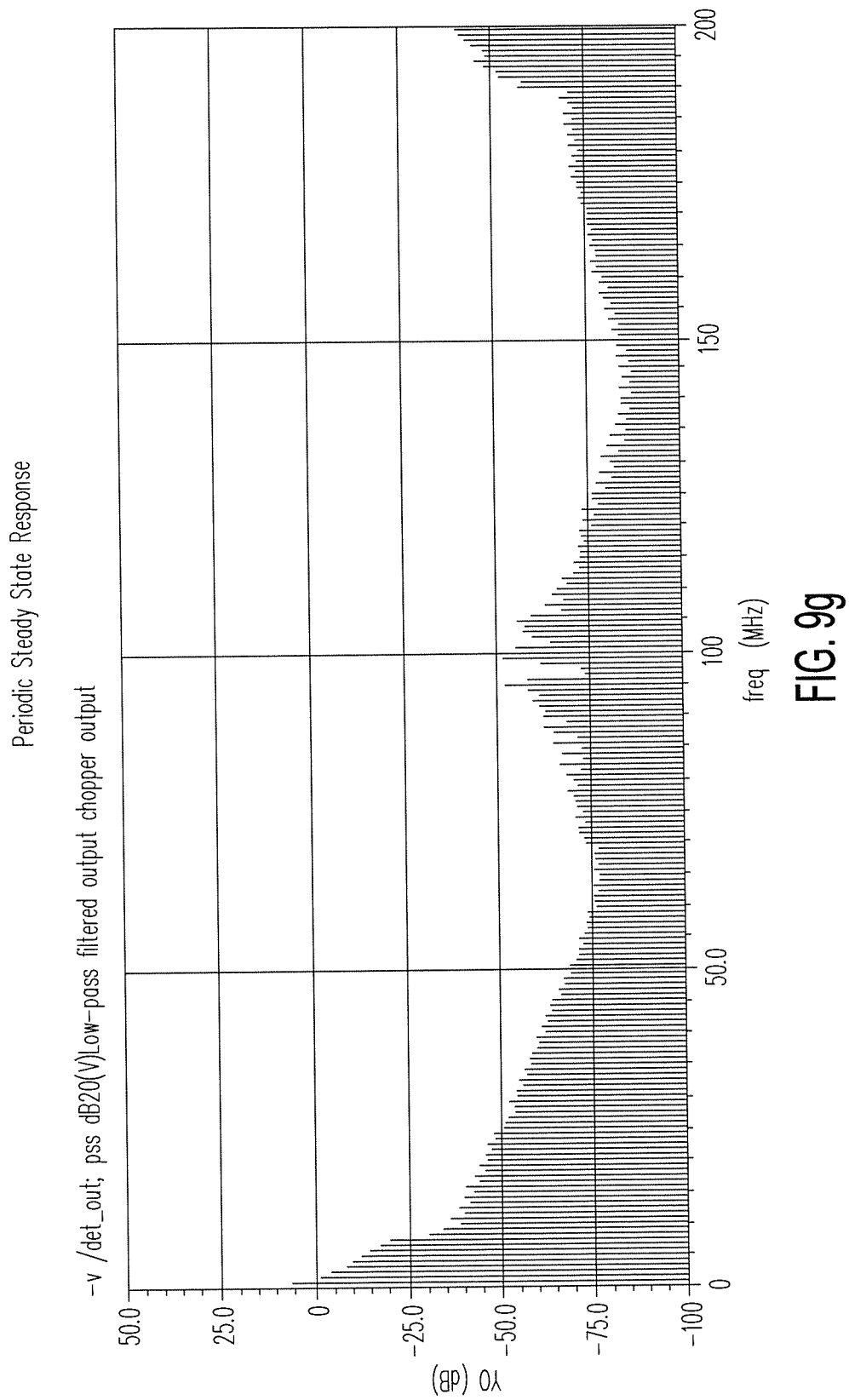

FIG. 9(e) show the spectrum of the output signal at square cell 307a, including an additional output current offset $Y_{OS1}$, which adds an impulse at f=0. FIG. 9(f) shows the spectrum of the output signal at the output terminal of switch 305a. FIG. 9(g) shows the spectrum of output signal 305, after low-pass filtering.

Figure 10:
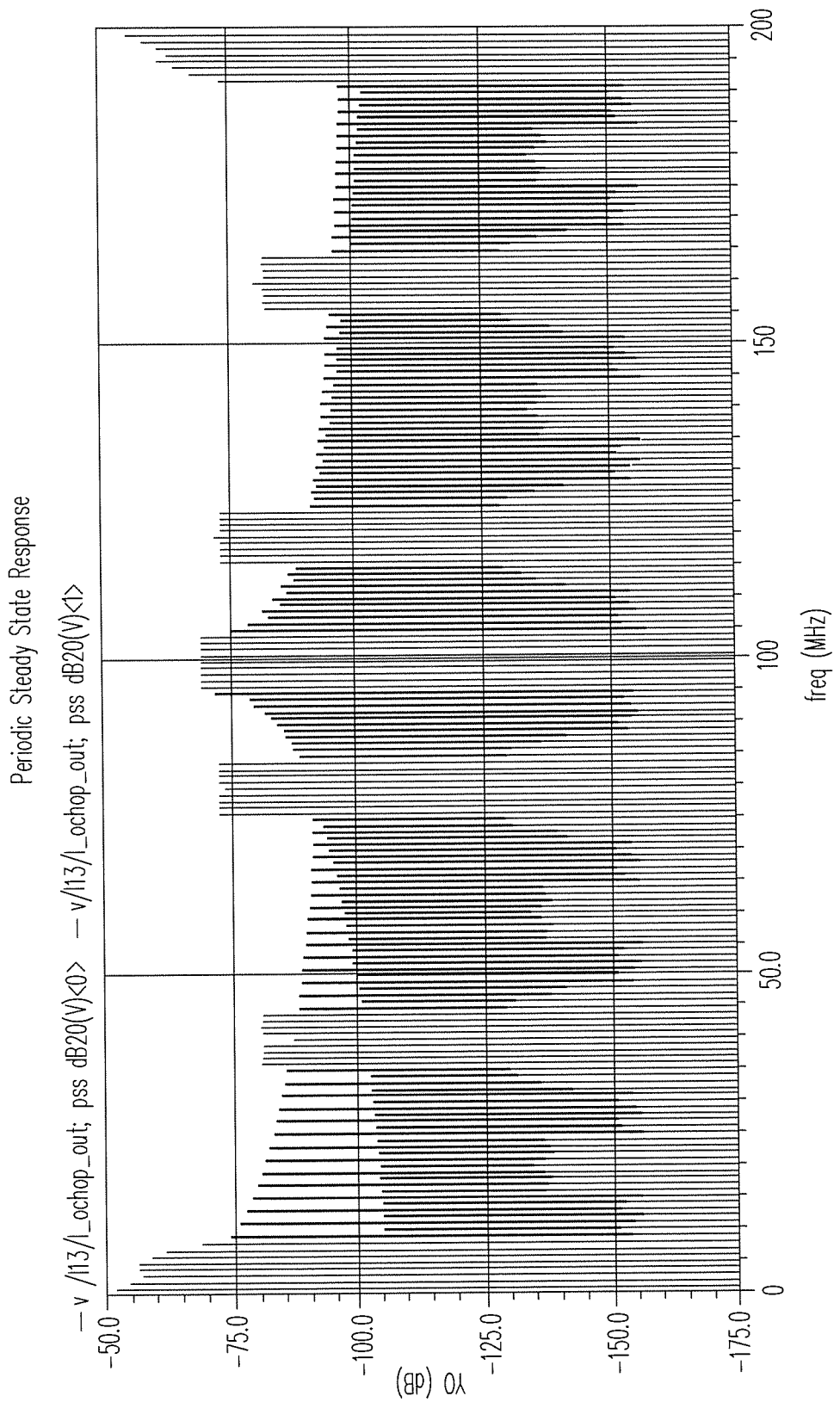
FIG. 10 illustrate the output spectra of the output signal of square cell 307a for both a 1 MHz chopper clock frequency (dark) and a 20 MHz chopper clock frequency (light).

FIG. 10 illustrates the output spectra of the output signal of square cell 307a for both a 1 MHz chopper clock frequency (dark) and a 20 MHz chopper clock frequency (light). In both cases the same signal spectrum is reproduced around DC. With a 1 MHz clock, more side bands are visible in the same bandwidth as with the 20 MHz clock (in fact, 20 times as many).

Figure 11:
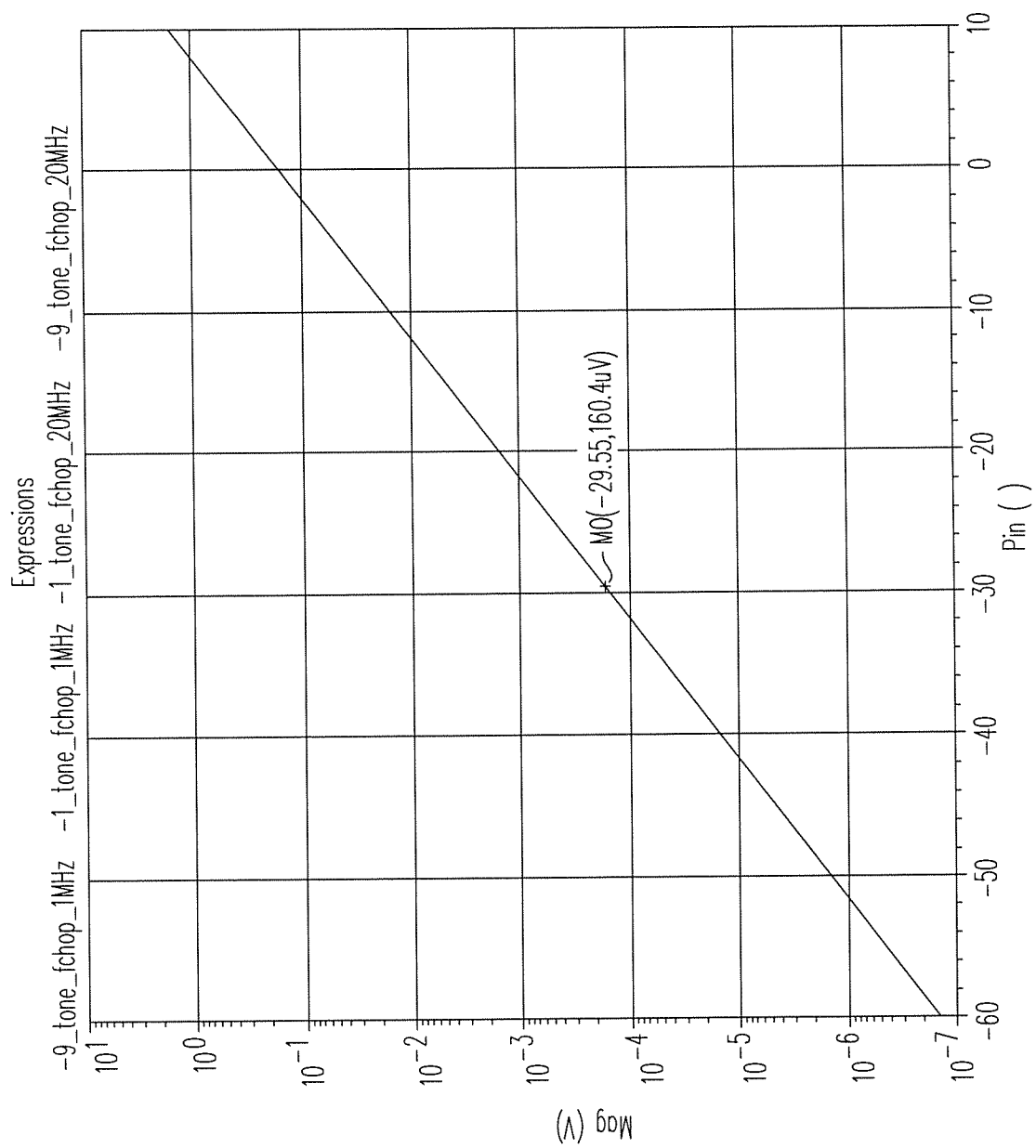
FIG. 11 shows the response of square cell 307a for a 1-tone and 9-tone input signal (same average power) at chopper frequencies of 1 MHz and 20 MHz.

FIG. 11 shows the response of square cell 307a for a 1-tone and 9-tone input signal (same average power) at chopper frequencies of 1 MHz and 20 MHz. The responses are virtually the same, despite the very different frequency spectra, as seen from corresponding FIGS. 6(a) to 6(g) and 9(a) to 9(g).

Figure 12:
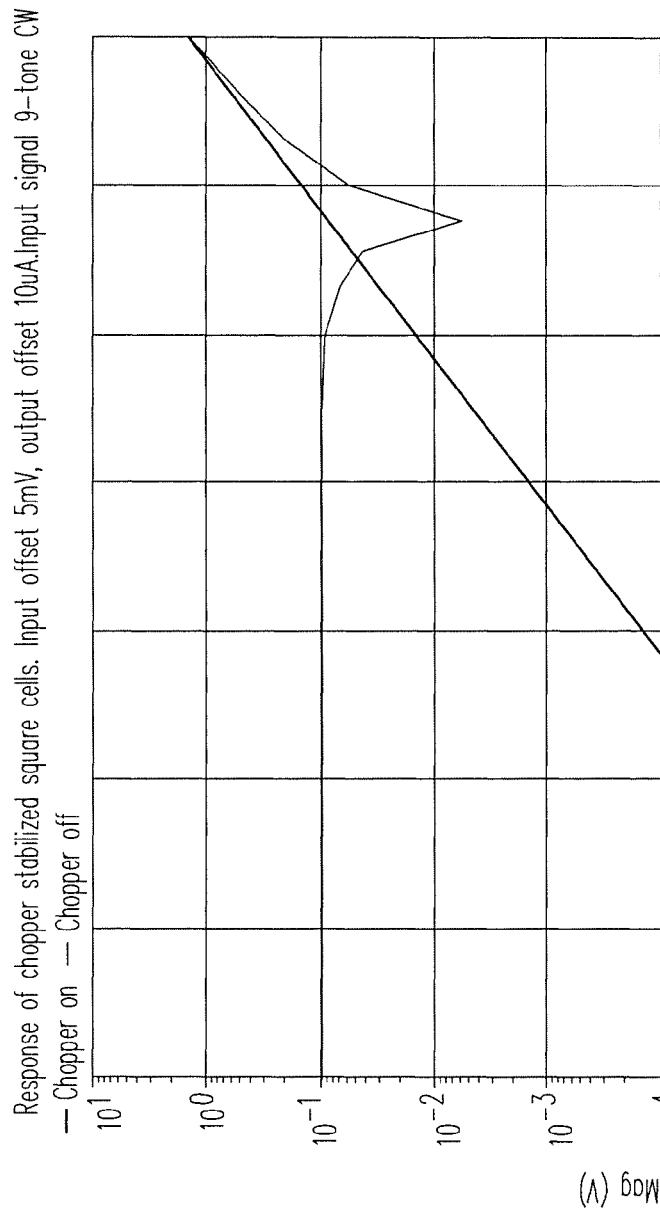
FIG. 12 illustrates the effectiveness of the choppers in eliminating DC offset from the square cell transfer function.

FIG. 12 illustrates the effectiveness of the choppers in eliminating DC offset from the square cell transfer function. An input offset voltage of 5 mV and output offset current of 10 µA was inserted in a Verilog-A model of a chopper-stabilized square cell. When the chopper is turned off (light), the offsets completely saturate the square cell output, leaving virtually no useful square cell dynamic range. With the chopper is turned on (dark), the offset is completely removed from the output signal.

Figure 15:
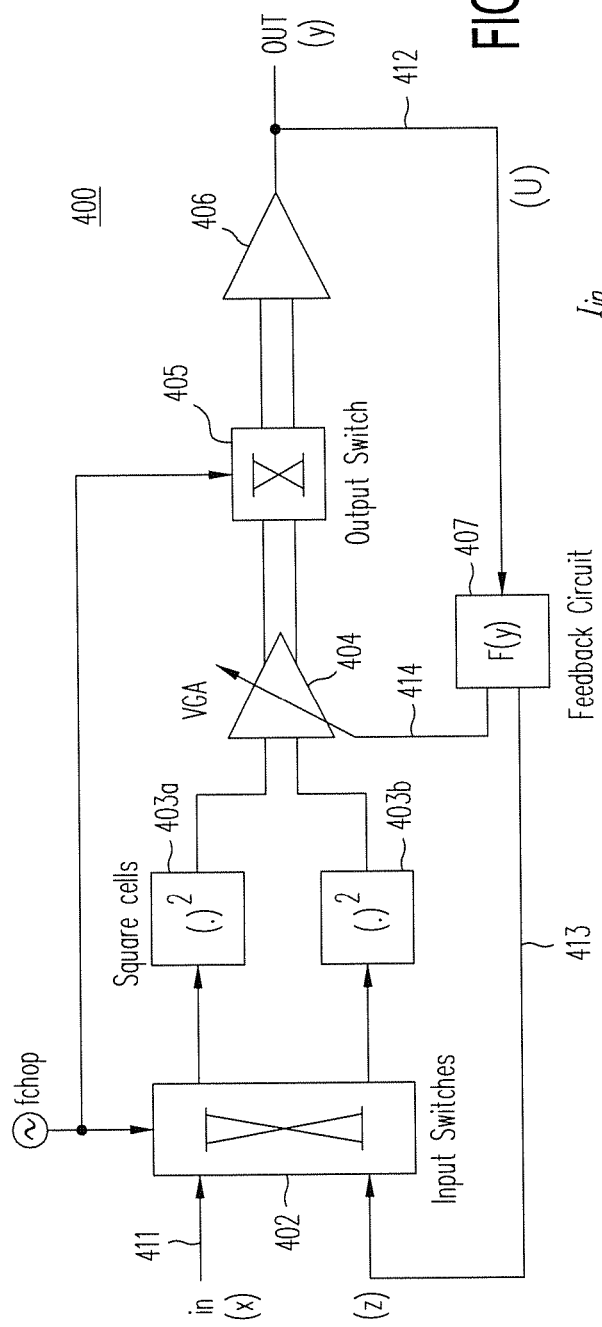
FIG. 15 shows RMS-DC converter 400 based on the chopper stabilized square cells, in accordance with one embodiment of the present invention.
Figure 16:
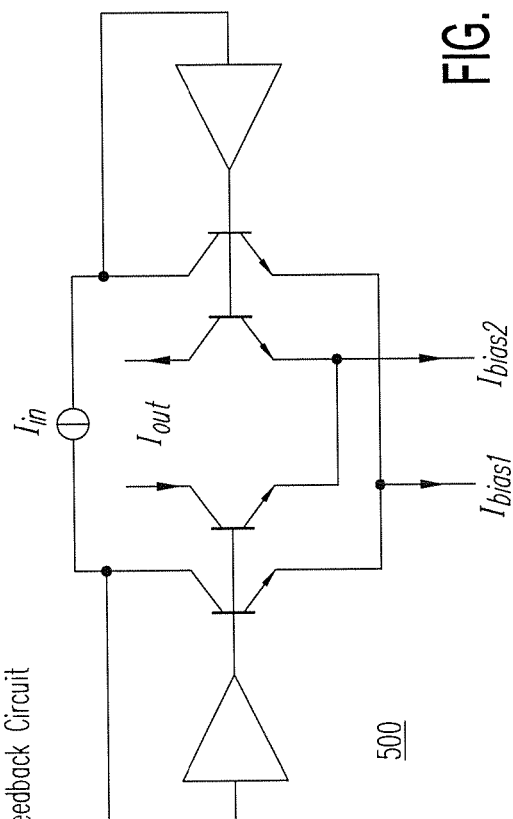
FIG. 16 shows variable gain amplifier 500 suitable for implementing variable gain amplifier 404.
Figure 17:
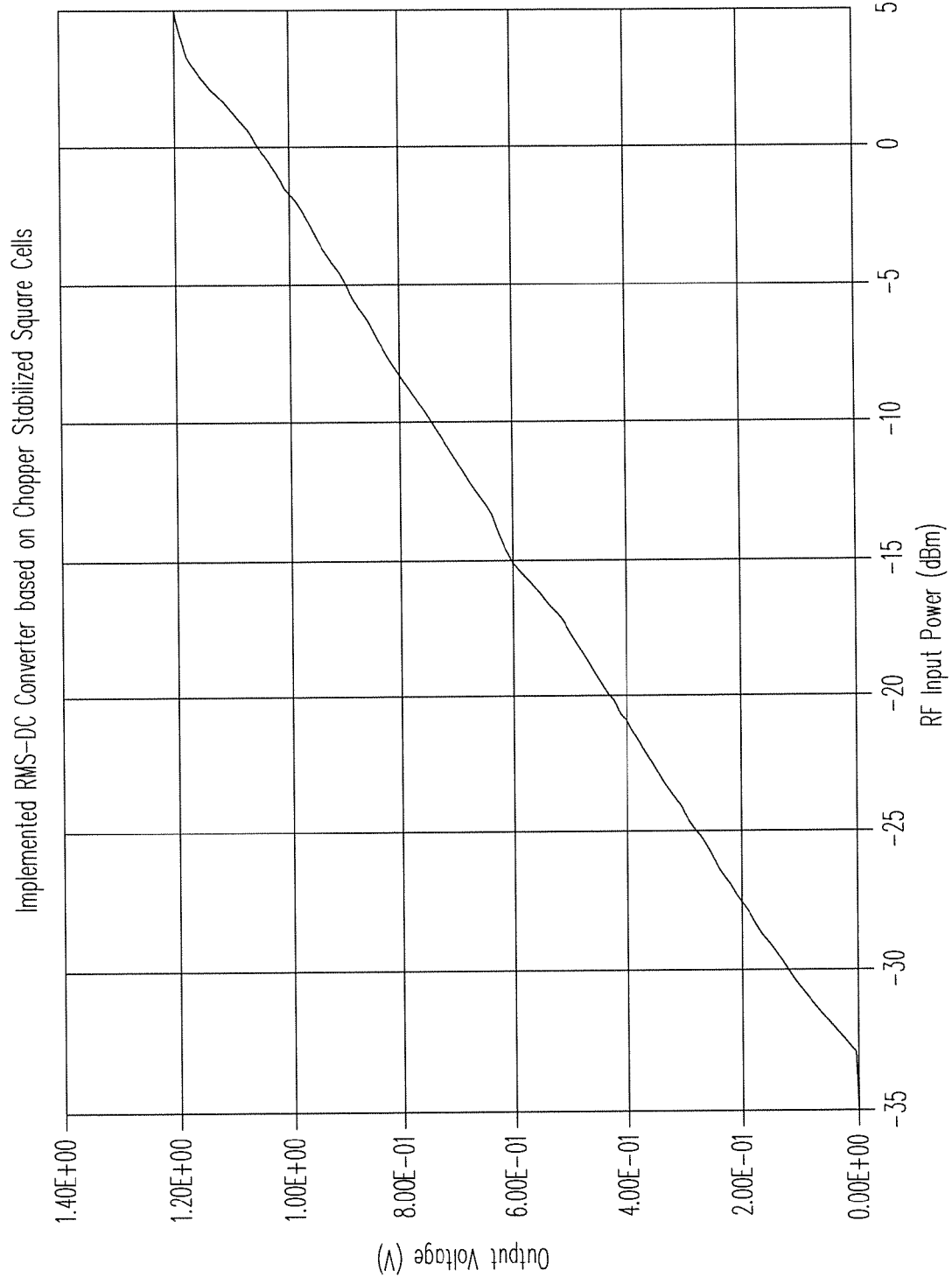
FIG. 17 shows the transfer function of RMS-DC converter 400, plotted as the voltage of output signal 412 versus RMS power of input signal 411.

FIG. 15 shows RMS-DC converter 400 based on the chopper stabilized square cells, in accordance with one embodiment of the present invention. As shown in FIG. 15, square cells 403a and 403b are chopped by switch networks 402 and 405 based on the principles described above with respect to chopper-stabilized square cell 300 of FIG. 3. In FIG. 15, RMS-DC converter 400's output signal 412 is provided to feedback circuit 407, which provides control signal 413 to reference input terminal of chopper-stabilized square cell 403a at switch network 402. Control signal 413 performs the same function as input reference signal 302 of FIG. 3. Control signal 413 may be a DC or AC signal derived from output signal 412. As shown in FIG. 15, feedback circuit 407 may provide control signal 414, which controls the gain of a variable gain amplifier 404 in the forward path. The inclusion of a variable gain amplifier 404 is not required, but helps to maintain a substantially constant loop-gain in RMS-DC converter 400 over the full operating power range. FIG. 16 shows variable gain amplifier 500 suitable for implementing variable gain amplifier 404. In steady state, the average output signal of square cells 403a and 403b are equal, such that the overall transfer from RMS input signal 411 to DC output signal 412 approaches the inverse of the transfer function of feedback circuit 407. FIG. 17 shows the transfer function of RMS-DC converter 400, plotted as the voltage of output signal 412 versus RMS power of input signal 411.

The above detailed description is provided to illustrate the specific embodiments of the present invention and is not intended to be limiting. Numerous variations and modifications within the scope of the present invention are possible. The present invention is set forth in the accompanying claims.

I claim:

1. An RMS-to-DC converter receiving an input signal and providing a converter output signal, comprising:
    a chopper-stabilized square cell receiving the input signal and a feedback signal to provide the converter output signal;
    a feedback circuit receiving the converter output signal and providing the feedback signal to the chopper-stabilized square cell; and
    a variable gain amplifier that amplifies the converter output signal of the chopper-stabilized square cell, wherein the feedback circuit adjusts a gain of the variable gain amplifier.

2. The RMS-to-DC converter of claim 1, wherein the chopper-stabilized square cell receives the input signal as a first signal and the feedback signal as a second signal and provides a first output signal and a second output signal, the chopper-stabilized square cell comprising:
    a first square cell;
    a second square cell, wherein the first and second square cells each receive an input signal and provide an output signal;
    an input switch circuit operated by the clock signal to provide the first signal and the second signal in an alternating manner to the first square cell and the second square cell, such that when the first signal is provided as the input signal to the first square cell, the second signal is provided as input signal to the second square cell and when the first signal is provided as the input signal to the second square cell, the second signal is provided as input signal to the first square cell; and
    an output switch circuit operated by the clock signal to provide the output signal of the first square cell and the output signal of the second square cell in an alternating manner as the first output signal and the second output signal, such that when the output signal of the first square cell is provided as the first output signal, the output signal of the second square cell is provided as the second output signal and when the output signal of the first square cell is provided as the second output signal, the output signal of the second square cell is provided as the first output signal.

3. The RMS-to-DC converter of claim 2, further comprising an output amplifier that amplifies the converter output signal of the chopper-stabilized square cell and which is responsive to an average difference between the first and second output signals of the first and second square cells.

4. The RMS-to-DC converter of claim 2, the chopper-stabilized square cell further comprising a difference circuit receiving the first and second output signals to provide an output signal representing a difference between the first and second output signals.

5. The RMS-to-DC converter of claim 4, further comprising a low pass filter operating on the output signal of the difference circuit.

6. The RMS-to-DC converter of claim 2, further comprising a first high pass filter operating on the output signal of the first square cell and a second high pass filter operating on the output signal of the second square cell.

7. The RMS-to-DC converter of claim 2, wherein the input switch circuit comprises a first switch and a second switch.

8. The RMS-to-DC converter of claim 2, wherein the clock signal comprises a sinusoidal signal.

9. The RMS-to-DC converter of claim 2, wherein the clock signal comprises a square wave.

10. The RMS-to-DC converter of claim 2, wherein the input switch circuit and the output switch circuit operate by different phases of the clock signal.

11. The RMS-to-DC converter of claim 2, wherein the second signal comprises a DC reference signal.

12. The RMS-to-DC converter of claim 2, wherein the second signal comprises a signal of a predetermined waveform and power.

13. The RMS-to-DC converter of claim 2, wherein the clock signal has a frequency lower than frequencies of the first signal.

14. The RMS-to-DC converter of claim 2, wherein the clock signal has a frequency lower than a bandwidth of the first signal.

15. The RMS-to-DC converter of claim 2, wherein a center frequency of the first signal is an integral multiple of a frequency of the clock signal.

* * * * *